(12) United States Patent
Bang et al.

(10) Patent No.: US 12,622,104 B2
(45) Date of Patent: May 5, 2026

(54) SEMICONDUCTOR LIGHT EMITTING DEVICE FOR A DISPLAY PANEL AND DISPLAY DEVICE INCLUDING SAME

(71) Applicant: LG ELECTRONICS INC., Seoul (KR)

(72) Inventors: Hyungseok Bang, Seoul (KR); Sukkoo Jung, Seoul (KR); Hwankuk Yuh, Seoul (KR); Jaechoon Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 826 days.

(21) Appl. No.: 17/903,599

(22) Filed: Sep. 6, 2022

(65) Prior Publication Data

US 2023/0070225 A1     Mar. 9, 2023

(30) Foreign Application Priority Data

Sep. 6, 2021   (WO) ................ PCT/KR2021/012009

(51) Int. Cl.
H10H 20/831       (2025.01)
H01L 25/075       (2006.01)
(Continued)

(52) U.S. Cl.
CPC ...... H10H 20/8312 (2025.01); H10H 20/835 (2025.01); H10H 20/857 (2025.01)

(58) Field of Classification Search
CPC combination set(s) only.
See application file for complete search history.

(56) References Cited

U.S. PATENT DOCUMENTS 6,781,160 B1 *   8/2004   Tsai .................... H10H 20/82
                                              257/E33.068
9,825,202 B2    11/2017   Schuele et al.
(Continued)

FOREIGN PATENT DOCUMENTS

KR      10-2011-0127936 A      11/2011
KR      10-2012-0129449 A      11/2012
(Continued)

*Primary Examiner* — Mark W Tornow
*Assistant Examiner* — Priya M Rampersaud
(74) *Attorney, Agent, or Firm* — Birch, Stewart, Kolasch & Birch, LLP

(57)       ABSTRACT

The embodiment relates to a semiconductor light emitting device for a display panel and a display device including the same. The semiconductor light emitting device can include a light emitting structure comprising a first conductivity type semiconductor layer, an active layer, and a second conductivity type semiconductor layer, a first electrode layer electrically connected to the first conductivity type semiconductor layer, a second reflective electrode layer electrically connected to the second conductivity-type semiconductor layer, a passivation layer disposed on the light emitting structure, a first reflective electrode layer disposed on a side surface of the light emitting structure. The first reflective electrode layer can include a first-first reflective electrode layer in contact with a side surface of the light emitting structure and a first-second reflective electrode layer connected to the first-first reflective electrode layer and disposed on the passivation layer.

7 Claims, 17 Drawing Sheets

(51) Int. Cl.
    *H10H 20/832*     (2025.01)
    *H10H 20/857*     (2025.01)

(56)              References Cited

U.S. PATENT DOCUMENTS

| | | | | |
|---|---|---|---|---|
| 2009/0039371 A1* | 2/2009 | Kim | H10H 20/835 | |
| | | | | 257/98 |
| 2009/0121241 A1* | 5/2009 | Keller | H10H 20/857 | |
| | | | | 257/E33.068 |
| 2011/0284910 A1* | 11/2011 | Iduka | H10H 20/8314 | |
| | | | | 257/E33.062 |
| 2012/0007128 A1* | 1/2012 | Kim | H10H 20/8314 | |
| | | | | 257/E33.072 |
| 2021/0320226 A1* | 10/2021 | Sugawara | H10H 20/8316 | |
| 2022/0173276 A1* | 6/2022 | Teo | H10H 20/816 | |
| 2023/0005887 A1* | 1/2023 | Kwon | H01L 25/0753 | |
| 2023/0107331 A1 | 4/2023 | Heo et al. | | |
| 2023/0110862 A1 | 4/2023 | Kim et al. | | |
| 2023/0307598 A1* | 9/2023 | Park | H01L 24/95 | |
| 2024/0266491 A1* | 8/2024 | Chung | H01L 25/0753 | |

FOREIGN PATENT DOCUMENTS

| | | | | |
|---|---|---|---|---|
| KR | 10-2013-0007126 A | 1/2013 | | |
| KR | 10-2015-0061844 A | 6/2015 | | |
| KR | 10-2019-0121274 A | 10/2019 | | |
| KR | 10-2020-0023328 A | 3/2020 | | |
| KR | 10-2020-0026845 A | 3/2020 | | |
| WO | WO-2020044991 A1 * | 3/2020 | H10H 20/833 | |
| WO | WO-2021107237 A1 * | 6/2021 | H01L 25/0753 | |

\* cited by examiner

[FIG. 1A]
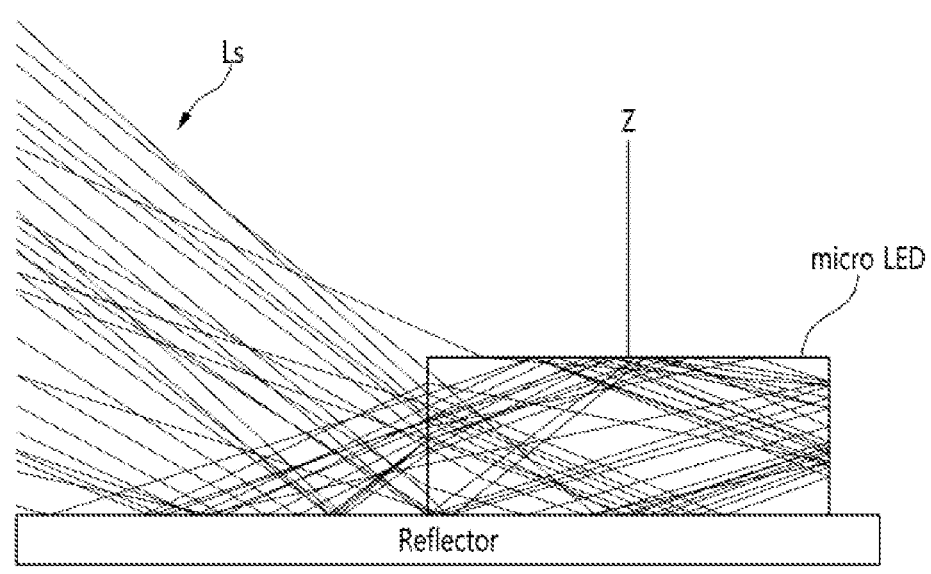
[FIG. 1B]
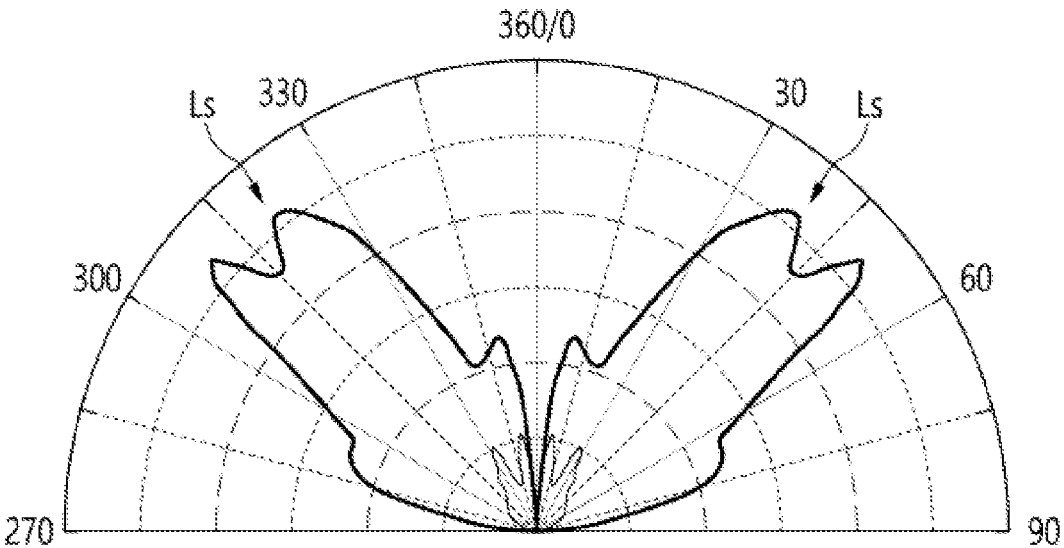

[FIG. 1C]
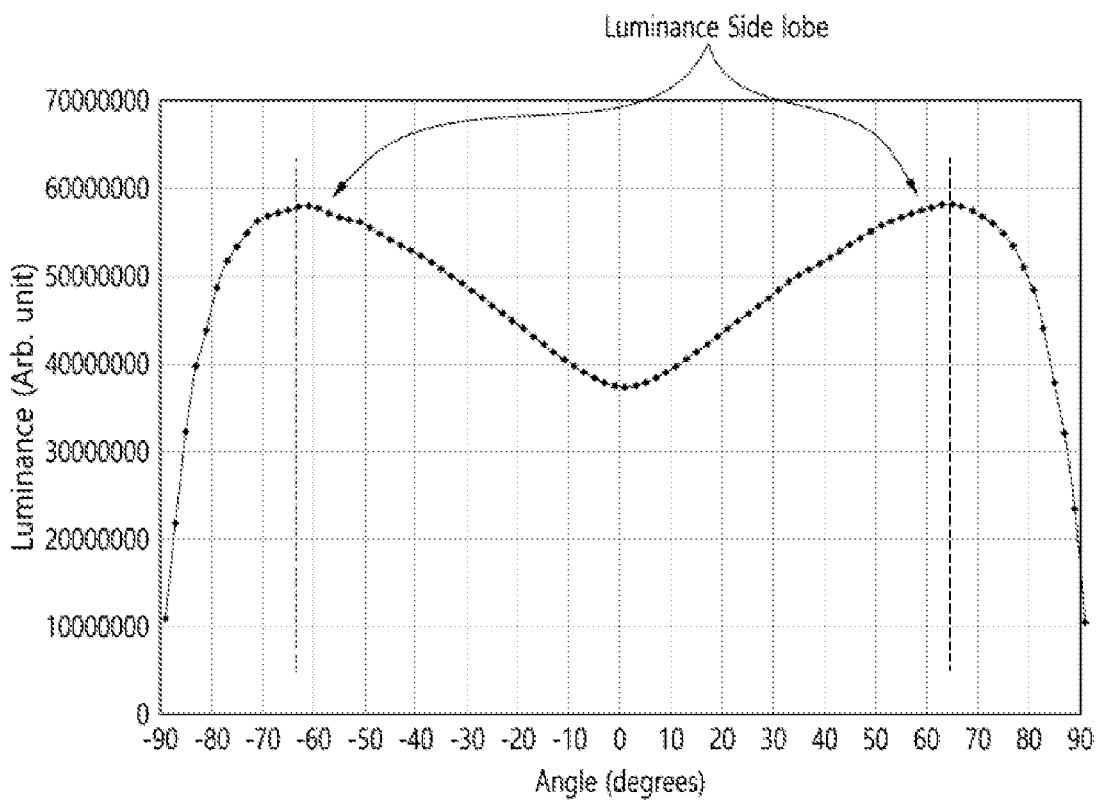

[FIG. 2]
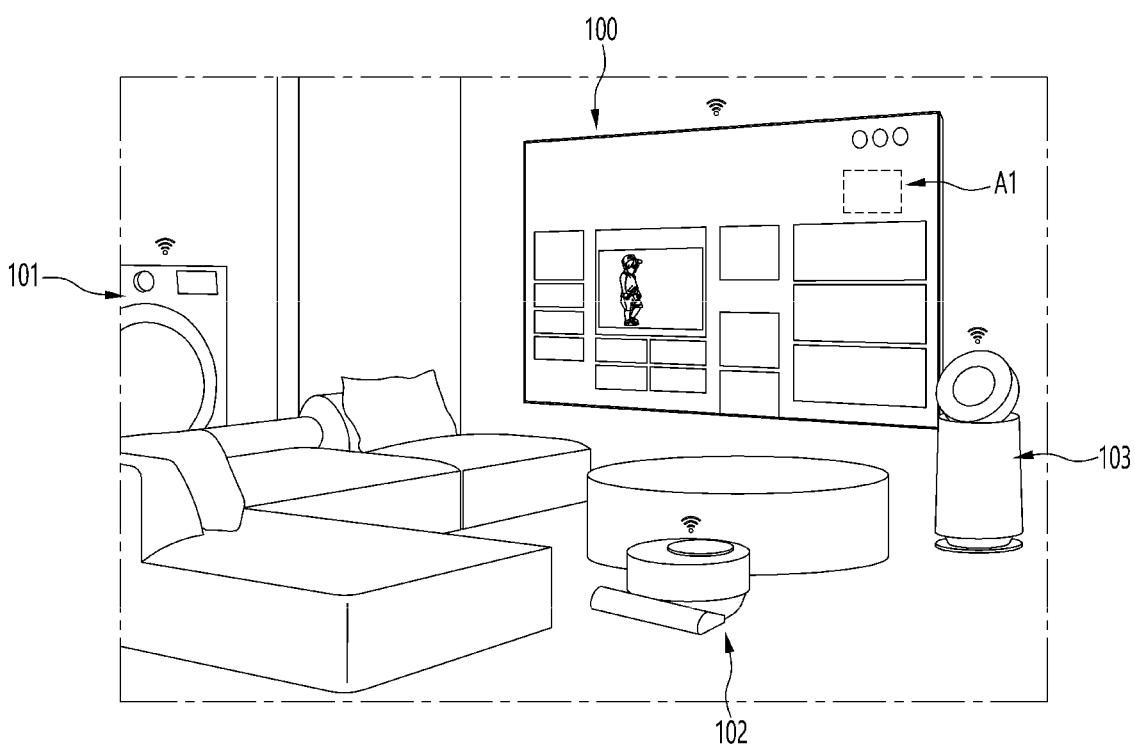

[FIG. 3A]
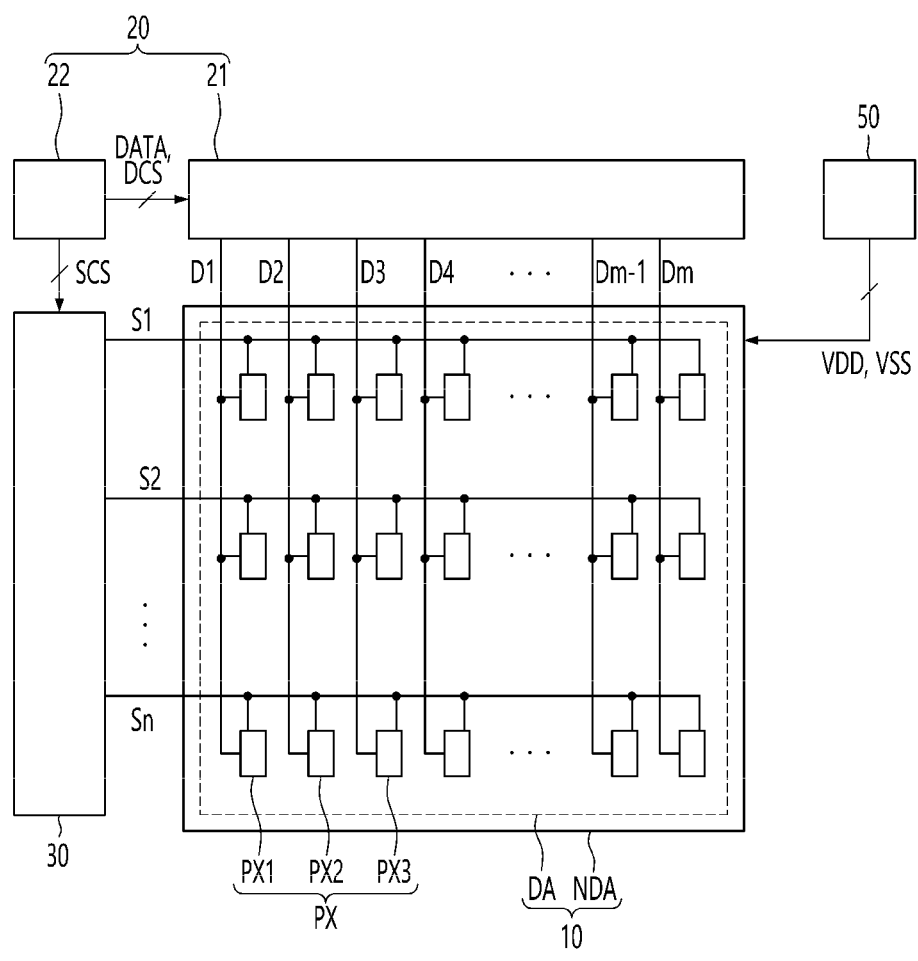

[FIG. 3B]
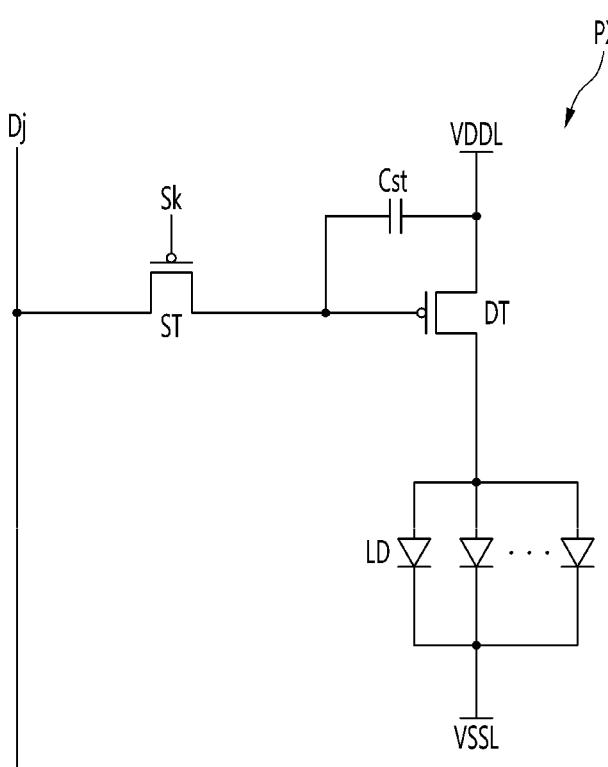

[FIG. 4]
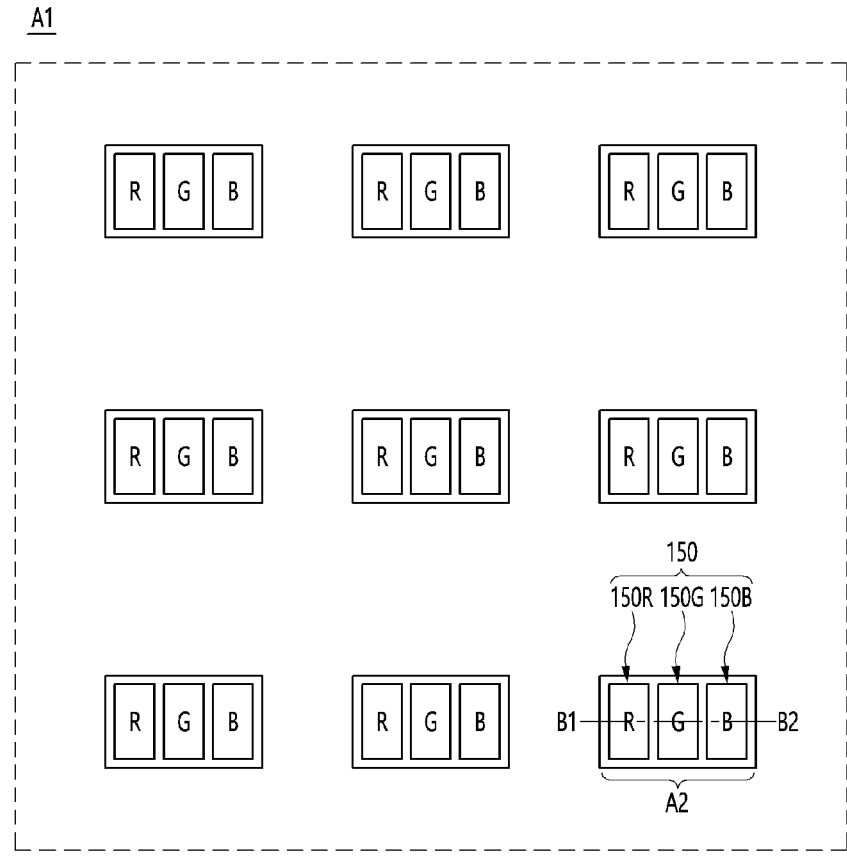

[FIG. 5]
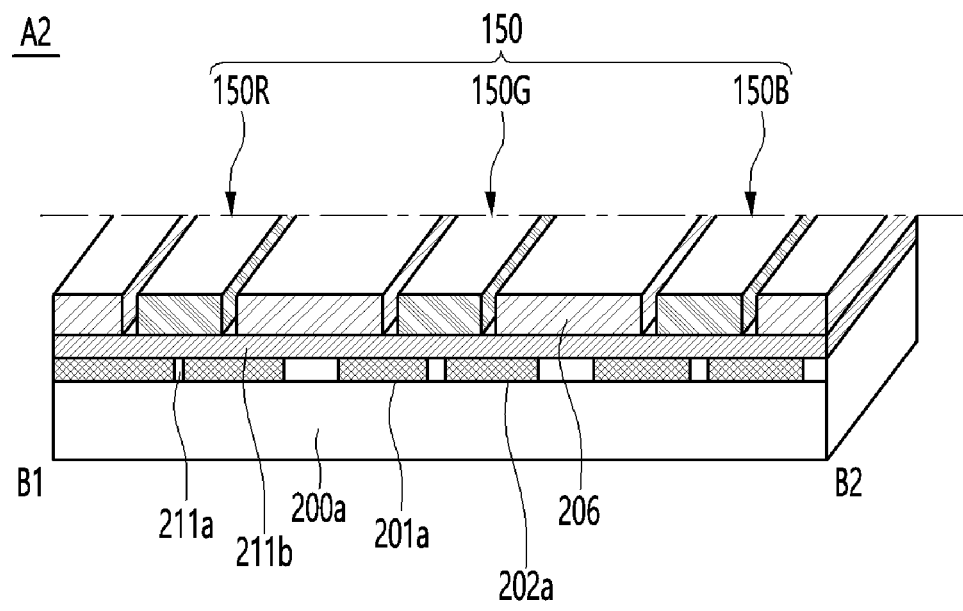
[FIG. 6]
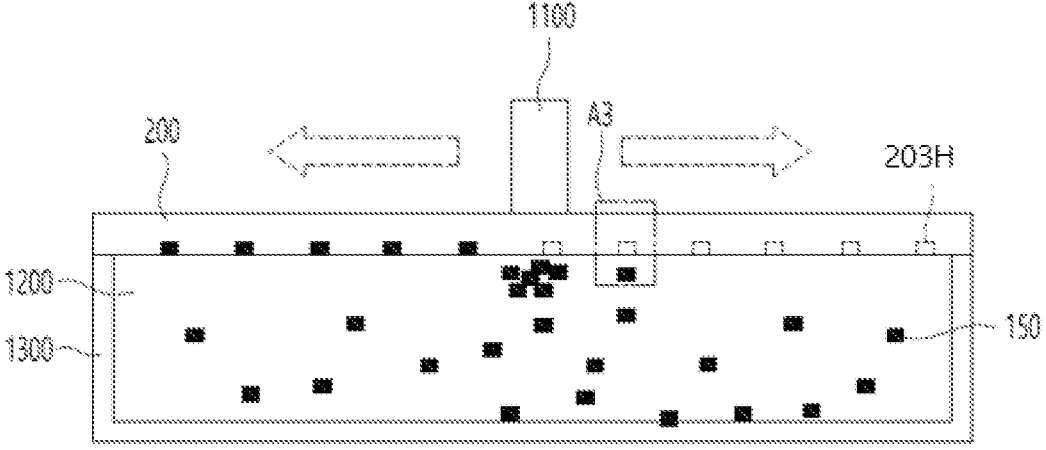

[FIG. 7]
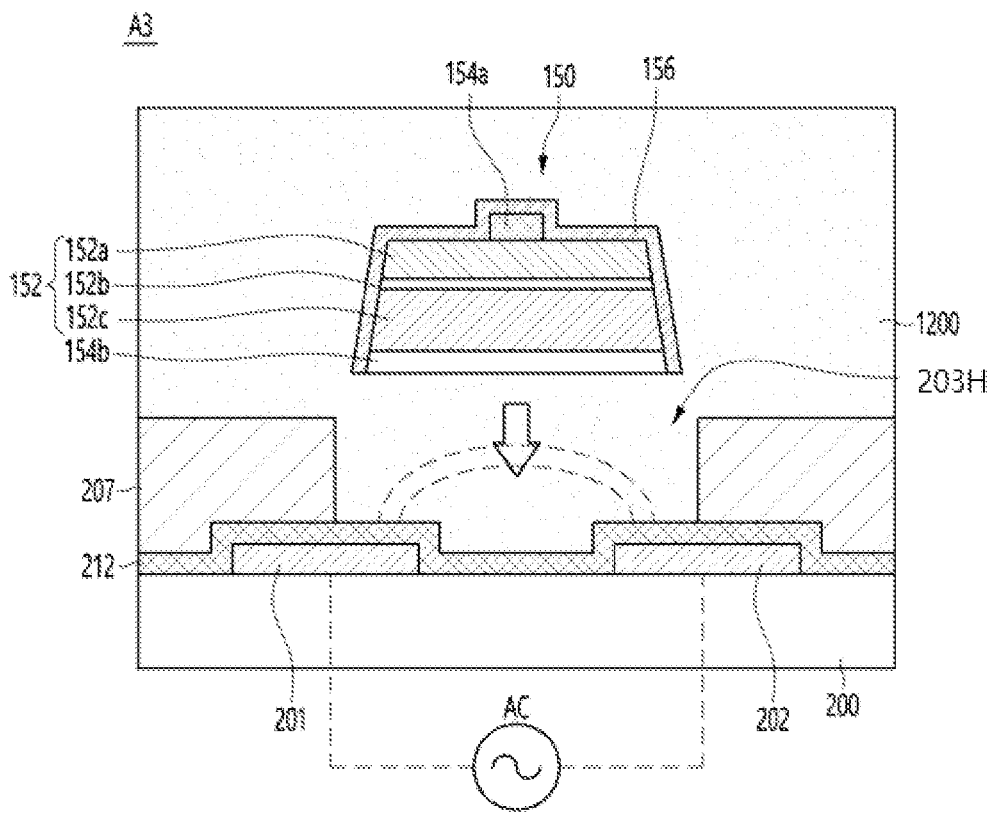

[FIG. 8]
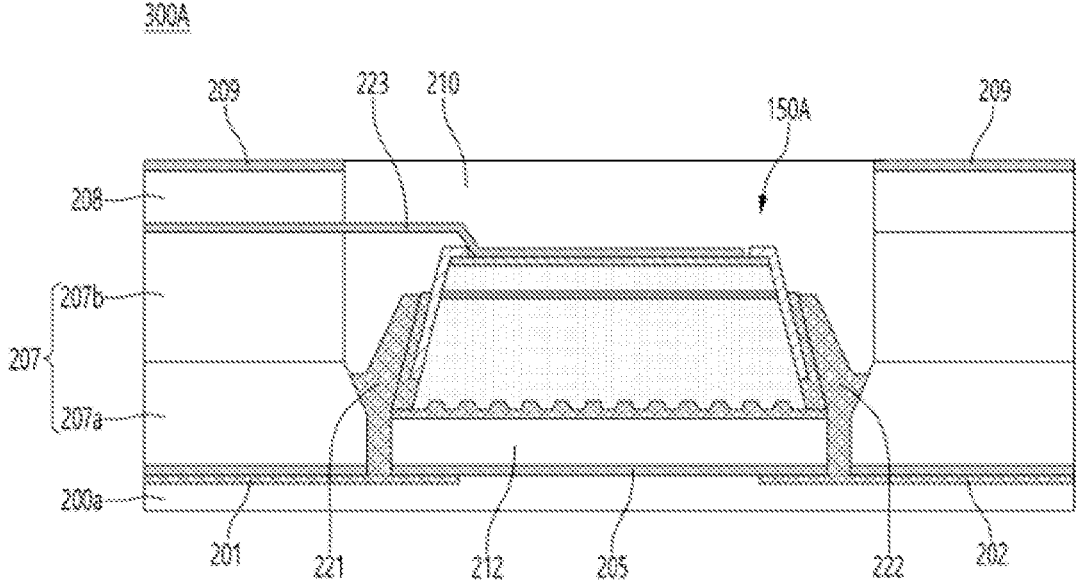
[FIG. 9A]
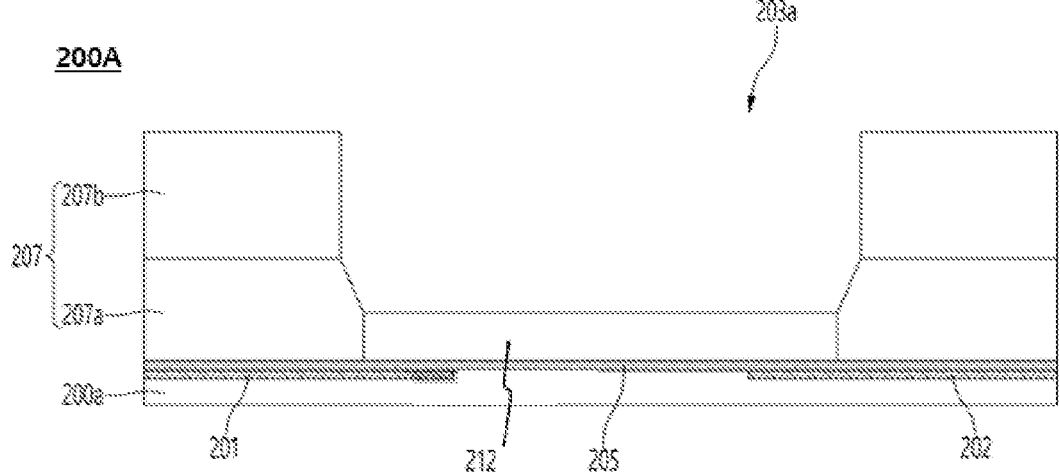

[FIG. 9B]
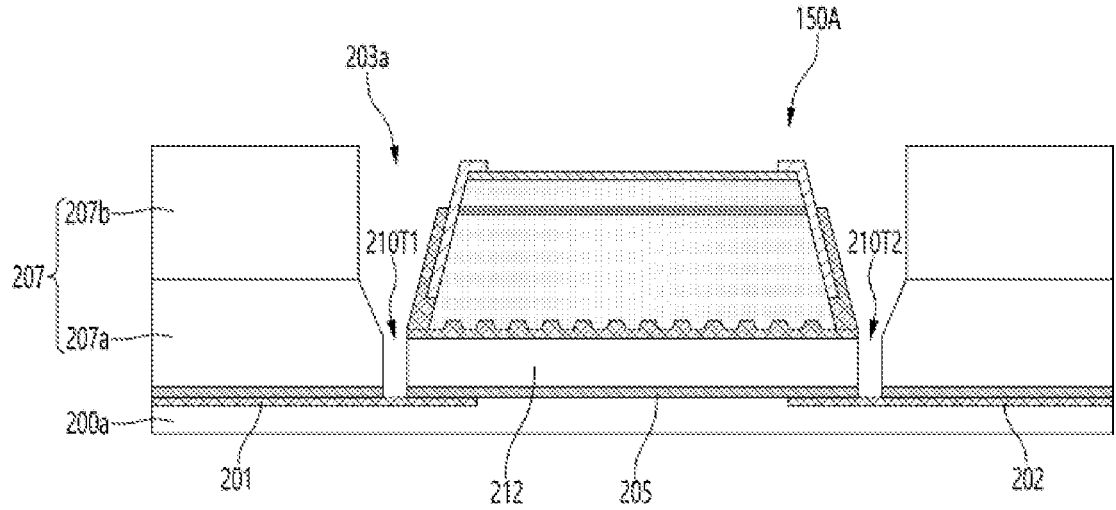
[FIG. 9C]
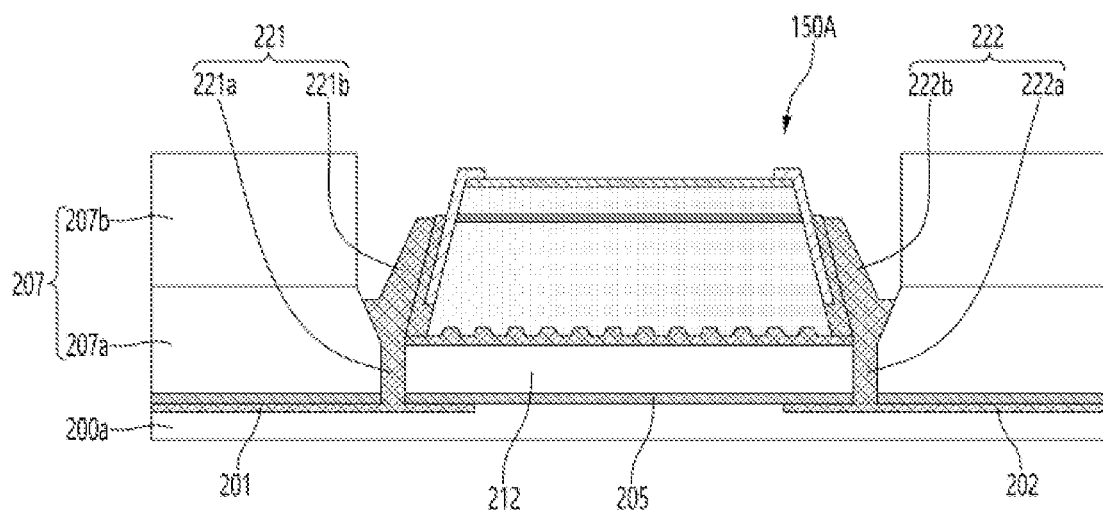

[FIG. 9D]
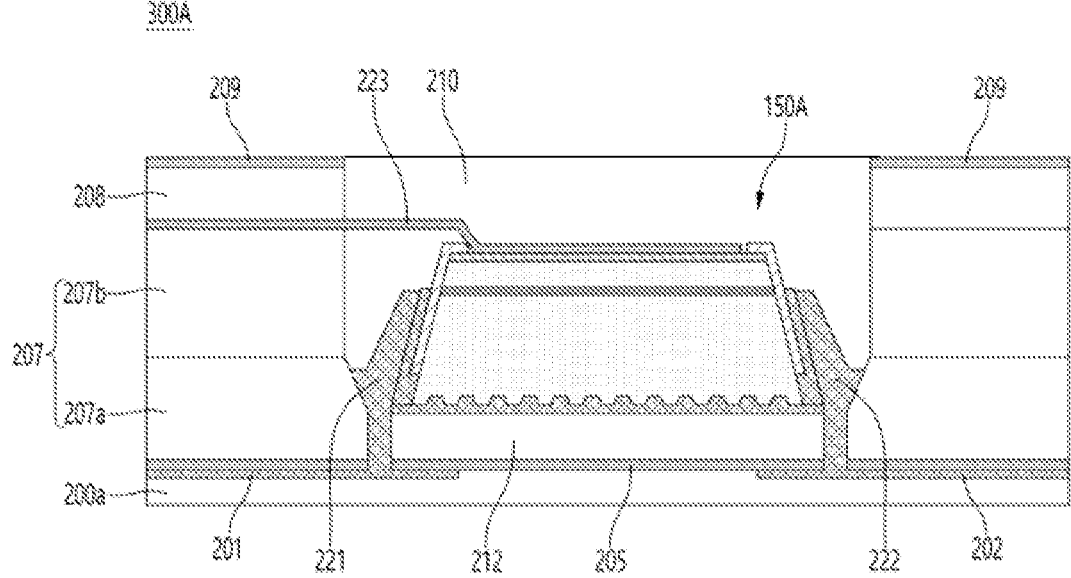
[FIG. 10A]
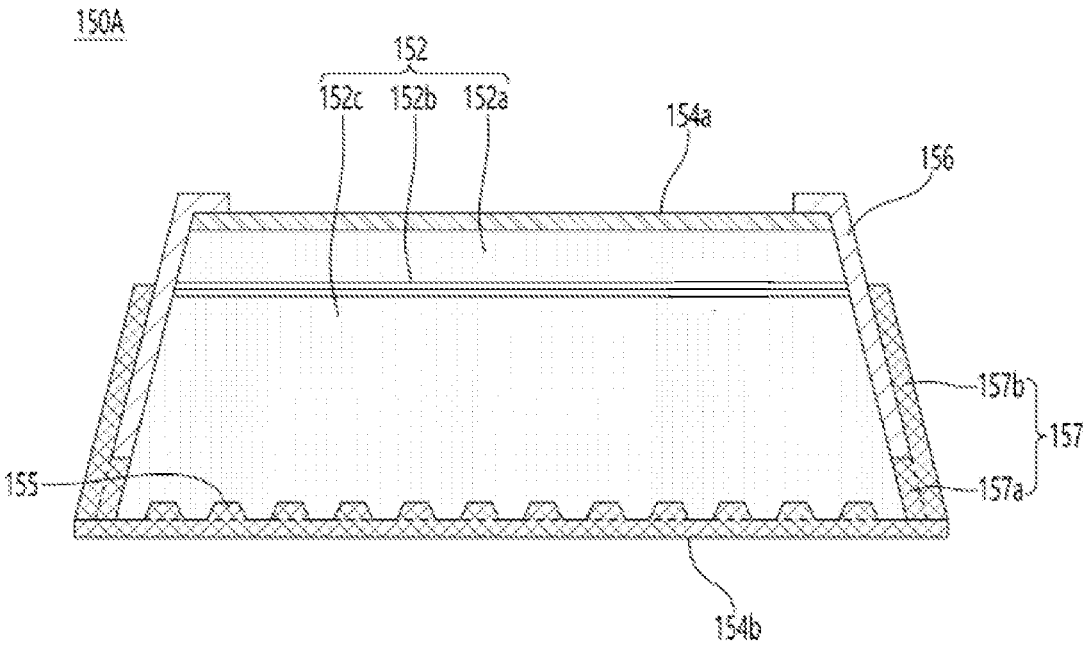

[FIG. 10B]
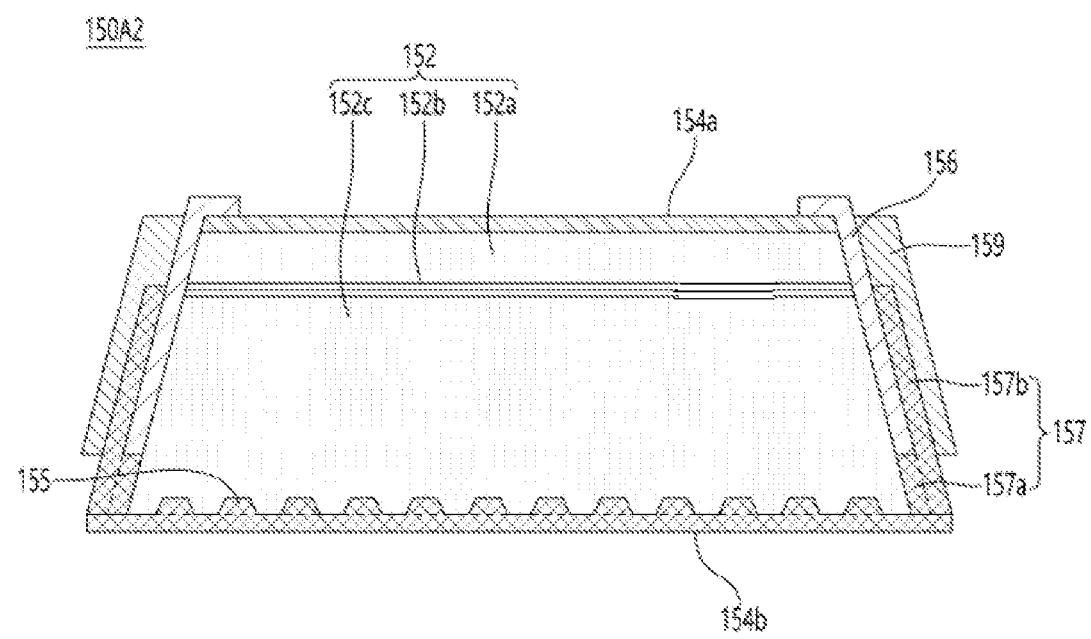

[FIG. 11]
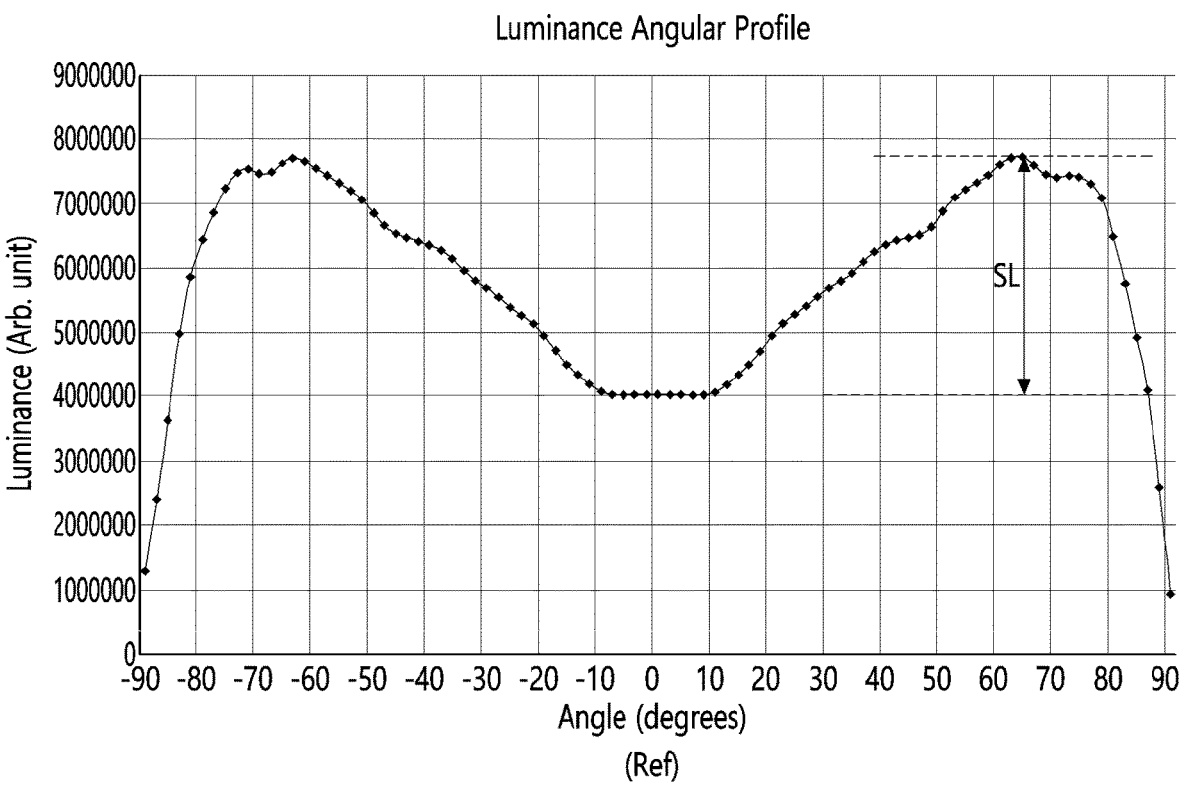
(Ref)
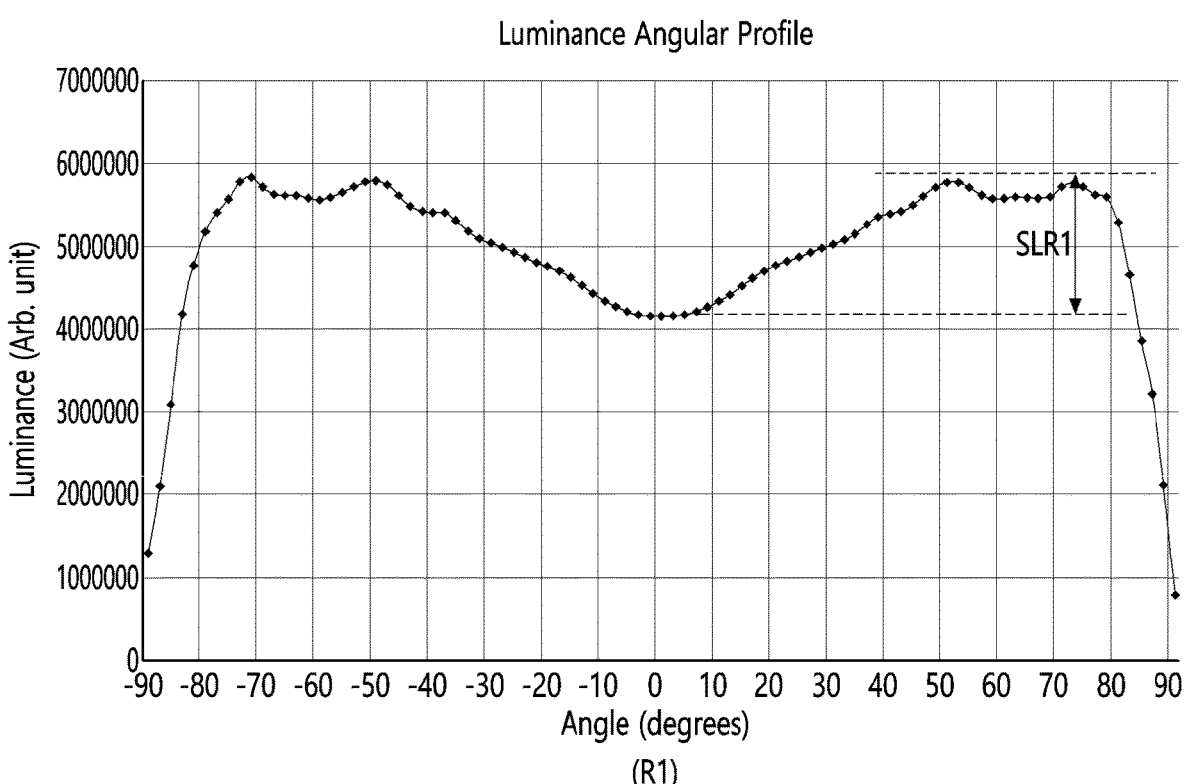
(R1)

[FIG. 12]
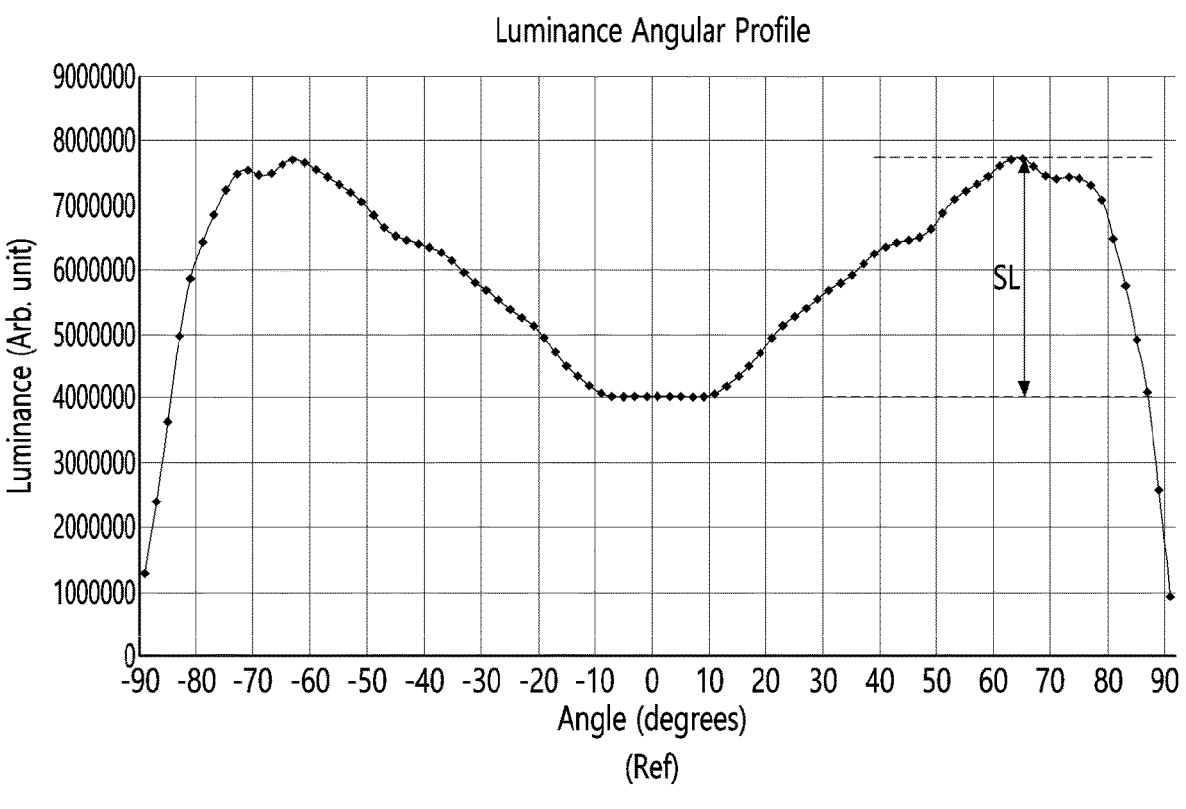
(Ref)
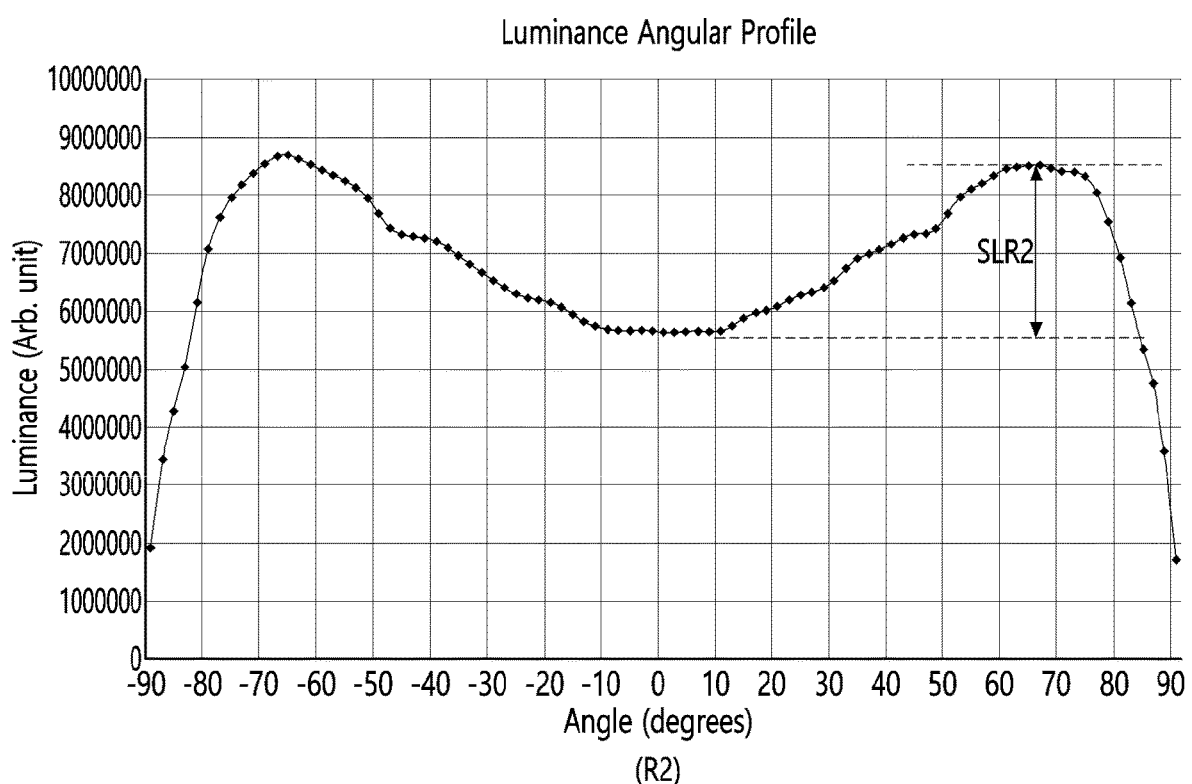
(R2)

[FIG. 13]
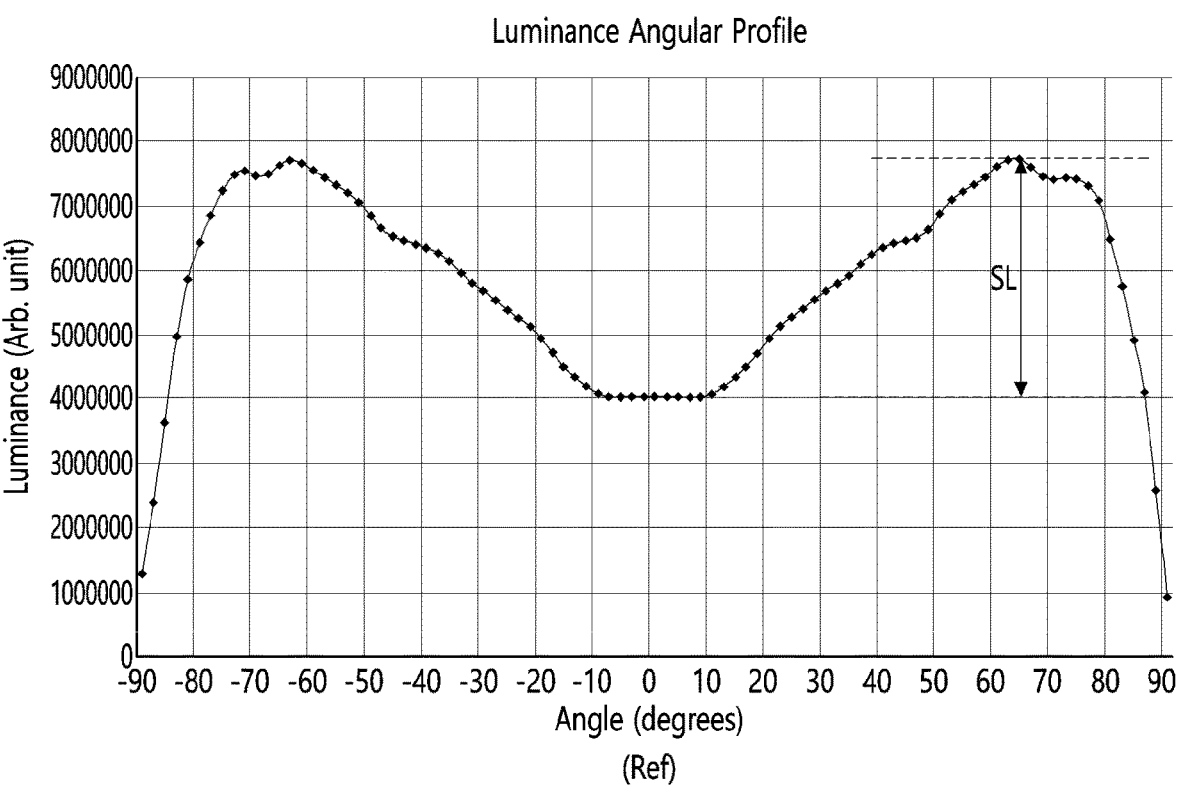
(Ref)
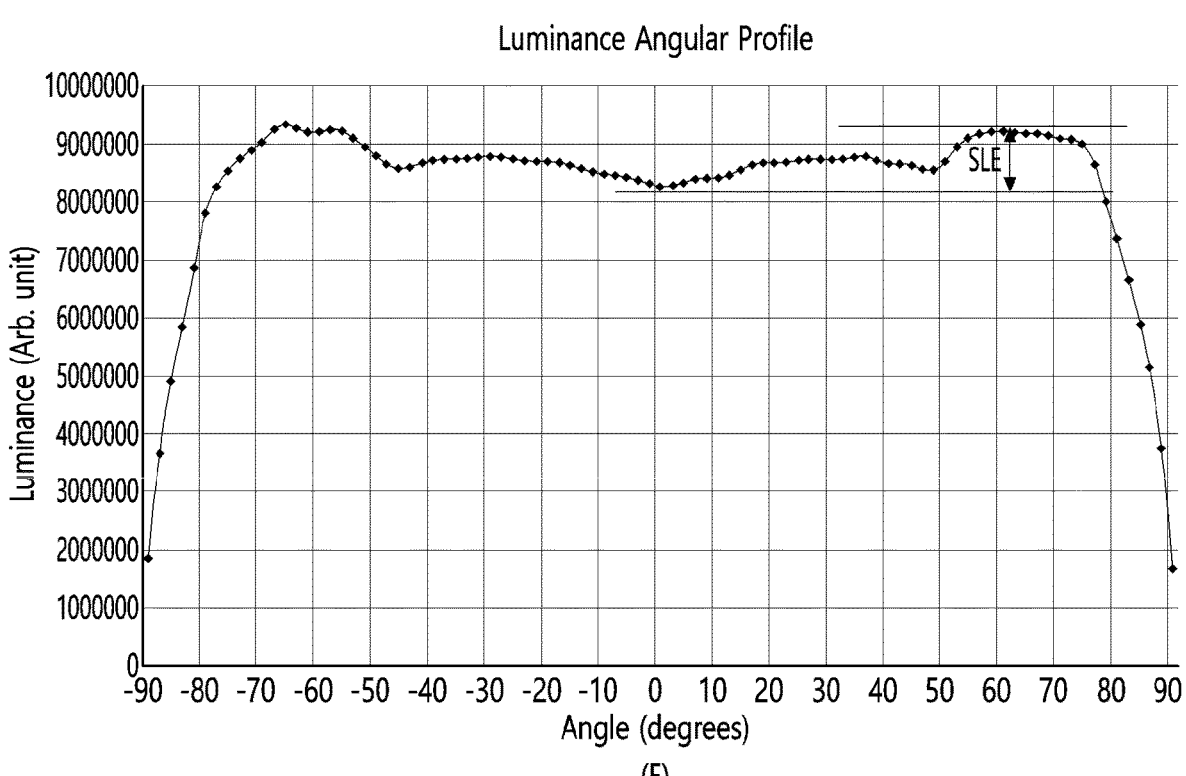
(E)

[FIG. 14]
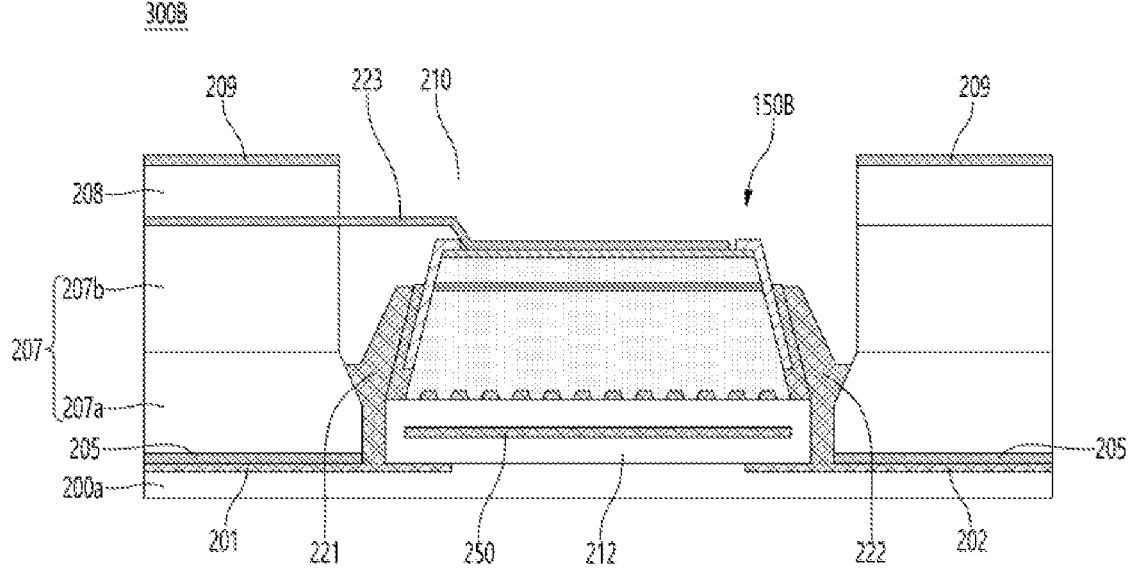
[FIG. 15]
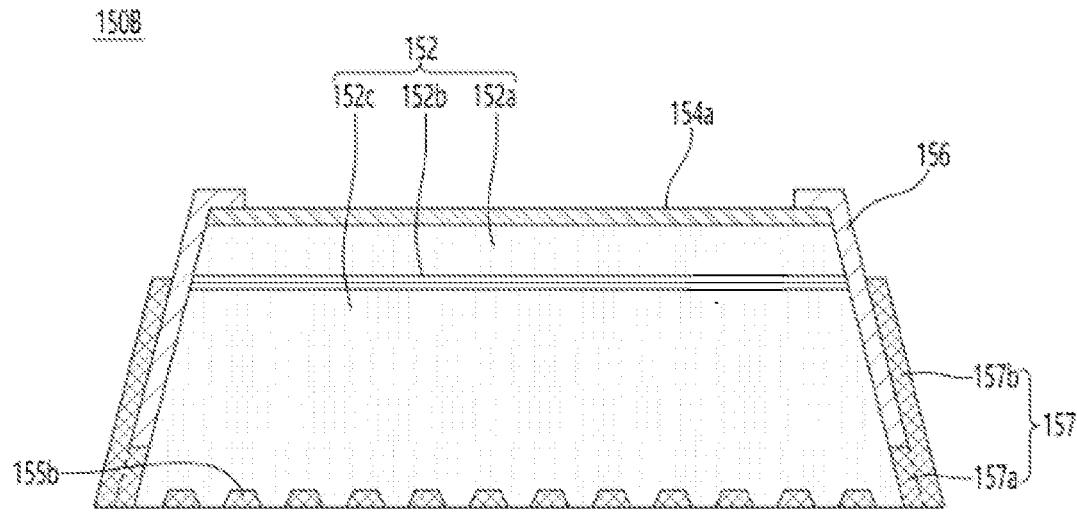

[FIG. 16]
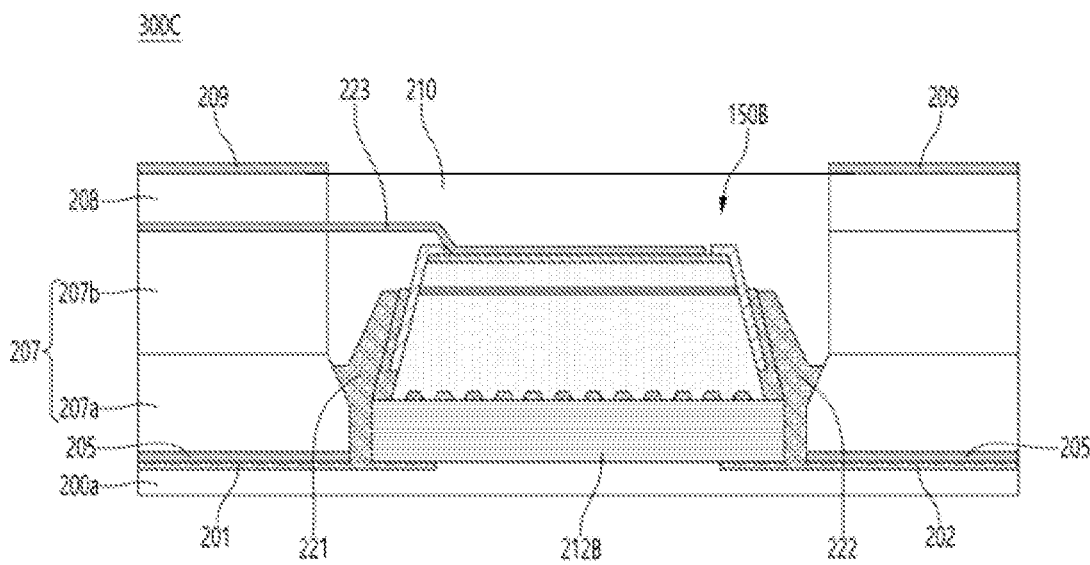

SEMICONDUCTOR LIGHT EMITTING DEVICE FOR A DISPLAY PANEL AND DISPLAY DEVICE INCLUDING SAME

CROSS-REFERENCE TO RELATED APPLICATION

Pursuant to 35 U.S.C. § 119(a), this application claims the benefit of an earlier filing date of and the right of priority to PCT Application No. PCT/KR2021/012009, filed on Sep. 6, 2021, the contents of which are incorporated by reference herein in its entirety.

BACKGROUND OF THE DISCLOSURE

1. Field of the Disclosure

The embodiment relates to a semiconductor light emitting device for a display panel, and a display device including the same.

2. Background of the Related Art

Large-area displays include liquid crystal displays (LCD), OLED displays, and micro-LED displays.

A micro-LED display is a display using a micro-LED, which is a semiconductor light emitting device having a diameter or cross-sectional area of 100 μm or less, as a display device.

Micro-LED display uses micro-LED, which is a semiconductor light emitting device, as a display device. Therefore, Micro-LED display uses micro-LED has excellent performance in many characteristics such as contrast ratio, response speed, color gamut, viewing angle, brightness, resolution, lifespan, luminous efficiency and luminance.

In particular, micro-LED displays have the advantage of being able to separate and combine screens in a modular way, so that size or resolution can be freely adjusted and flexible displays can be implemented.

However, since large-sized micro-LED displays require millions of micro-LEDs, there is a technical problem in that it is difficult to quickly and accurately transfer micro-LEDs to a display panel.

Transfer technologies that have been recently developed include a pick and place process, a laser lift-off method, or a self-assembly method.

Among these, the self-assembly method is a method in which the semiconductor light emitting device finds an assembly position in a fluid and is advantageous for realization of a large-screen display device.

Recently, although a micro-LED structure suitable for self-assembly has been proposed in U.S. Pat. No. 9,825,202, etc., research on a technology for manufacturing a display through self-assembly of micro-LED is still insufficient.

In particular, in the case of rapidly transferring millions of semiconductor light emitting devices to a large display in the prior art, although the transfer speed can be improved, there is a technical problem in that the transfer error rate can be increased, so that the transfer yield is lowered.

In the related art, a self-assembly method using dielectrophoresis (DEP) has been attempted, but the self-assembly rate is low due to the non-uniformity of the DEP force.

Meanwhile, in order for the semiconductor light emitting device to function as a light emitting source of a display panel rather than a light emitting source of lighting, it is very important to secure a color viewing angle, and high light efficiency is also required to reduce power consumption.

However, in order to secure a color viewing angle, the ratio of R, G, and B color light intensity to the emission angle in the required range is required to be equal, and the R, G, B color combination must maintain the same color coordinates.

Accordingly, it is very important to match the light quantity ratio according to the light output angle of the R, G, and B light sources in order to secure a color viewing angle and high light output efficiency for a semiconductor light emitting device functioning as a display element of a display panel.

In particular, according to internal research, in a semiconductor light emitting device that functions as a display device of a display panel, a side lobe phenomenon occurs in which the luminance is increased by emitting in the direction of the pixel on the side rather than the direction on the top side where the viewer is located in the luminance profile.

FIGS. 1A to 1C are luminance profile data of a Micro-LED-based display in the related art.

Specifically, FIG. 1A is a data of the output characteristic of the side emission light (Ls) dominant in the micro-LED display of the related art, FIG. 1B is a luminance profile of the panel by the side emission light (Ls), and FIG. 1C is a luminance profile distribution diagram for each angle of a Micro-LED-based display.

Referring to FIG. 1A, since the area of the side surface of the micro-LED chip is relatively large compared to the top surface, the ratio of the side emission light (Ls) emitted to the side surface of the micro-LED chip is high.

Specifically, as shown in FIG. 1B, the side emission light (Ls) to the side of the micro-LED chip proceeds at a large angle. Accordingly, a) the ratio of the light above a total reflection angle may increase, thereby reducing the light efficiency, and 2) a side lobe of the luminance profile by the light emitted at a large angle happens, especially as shown in FIG. 1C, 3) Each RGB chip has a different refractive index and geometric shape. Therefore, it causes difficulty in matching the ratio of the light of the three-color wavelengths from all angles.

Accordingly, the luminance profile side lobe is the main cause of the difficulty in matching the luminance profile for each angle of the RGB chip and is a major factor in Mura.

Meanwhile, according to an internal study, the side reflection structure was studied to reduce the side light output, but the luminance profile side lobe was not improved properly.

Accordingly, when a reflective structure is simply adopted on the side of the light emitting chip, a luminance side lobe that increases the amount of light emitted at a high light out angle still occurs. In addition, the light output profile of the micro-LED display is very sensitive to the geometric shape of the micro-LED chip, such as the inclination of the light source surface.

Therefore, it is very difficult to secure a color viewing angle of a display using the R, G, and B micro-LED chips having such characteristics as a light source. Therefore, it is necessary to secure a light source that is less sensitive to the geometric shape of the light source and can obtain a more uniform light output amount distribution in the required light output angle region.

SUMMARY OF THE DISCLOSURE

One of the technical problems of the embodiment is to provide a semiconductor light emitting device for a display panel capable of improving the light efficiency of a Micro-LED-based display and improving a color viewing angle at the same time, and a display device including the same.

Specifically, one of the technical tasks is to solve the problem of occurrence of the luminance side lobe in the embodiment.

For example, in the case of Micro-LED, due to the small chip size, the ratio of the amount of light emitted to the side of the chip increases. This causes the light emitted to the side of the chip to increase the amount of light having a high emission angle from the display panel, causing a luminance side lobe problem.

Also, the embodiment is one of the technical tasks to solve the issue of the sensitivity of the outgoing light profile sensitive to the geometry of the micro-LED chip.

For example, the geometry of mass-produced chips is being manufactured slightly differently depending on the process conditions and the position on the wafer. However, when the light output profile of each pixel is sensitive to the geometry of the micro-LED chip, there is a problem in securing the color viewing angle of the display.

In addition, the embodiment makes the improvement of the Ambient CR (Contrast Ratio) of the display panel as one of the technical tasks. For example, among spontaneous light sources, OLEDs have a severe external light incident, so the Ambient CR (Contrast Ratio) of the display panel is lowering, it is necessary to improve the ambient CR (contrast ratio) in the display panel using the spontaneous light source.

In addition, one of the technical tasks of the embodiment is to improve the light output efficiency by improving the light output limit.

For example, in the related art, in general, a total light reflection mode is formed inside a micro-LED chip, and the total light reflection mode does not emit light to the outside of the chip but disappears, causing a decrease in light efficiency.

The technical problems of the embodiment are not limited to those described in this item, and include those that can be understood through the specification.

A semiconductor light emitting device for a display panel according to an embodiment can include a first conductivity type semiconductor layer, an active layer, a light emitting structure including a second conductivity type semiconductor layer, a first electrode layer electrically connected to the first conductivity type semiconductor layer, and a second reflective electrode layer electrically connected to the second conductivity type semiconductor layer, a passivation layer disposed on the light emitting structure and a first reflective electrode layer disposed on a side surface of the light emitting structure.

The first reflective electrode layer can include a first-first reflective electrode layer in contact with a side surface of the light emitting structure and a first-second reflective electrode layer connected to the first-first reflective electrode layer and disposed on the passivation layer.

The height of the upper end of the first-second reflective electrode layer can be less than the height of the active layer.

The embodiment can further include a first scattering structure layer disposed on the bottom surface of the light emitting structure.

The first scattering structure layer can be disposed between the active layer and the second reflective electrode layer.

The first scattering structure layer can be integrally formed with the second reflective electrode layer.

The first scattering structure layer can be formed of the same material as that of the second reflective electrode layer.

The embodiment can further include a second passivation layer disposed on the first-second reflective electrode layer.

Also, a display device according to an embodiment can include a first electrode and a second electrode spaced apart from each other on a predetermined substrate, an insulating layer disposed on the first and second electrodes, a first barrier wall disposed on the insulating layer and including a first assembly hole.

The display device includes a semiconductor light emitting device disposed in the first assembly hole.

The semiconductor light emitting device can include a light emitting structure including a first conductivity type semiconductor layer, an active layer, and a second conductivity type semiconductor layer, a first electrode layer electrically connected to the first conductivity type semiconductor layer, a passivation layer disposed on the light emitting structure and a first reflective electrode layer disposed on a side surface of the light emitting structure.

The embodiment can further include a second reflective electrode layer electrically connected to the second conductivity type semiconductor layer.

The first reflective electrode layer can include a first-first reflective electrode layer in contact with a side surface of the light emitting structure and a first-second reflective electrode layer connected to the first-first reflective electrode layer and disposed on the passivation layer The embodiment can further include a first scattering structure layer disposed on the bottom surface of the light emitting structure.

The first scattering structure layer can be disposed between the active layer and the second reflective electrode layer.

The embodiment can further include a second passivation layer disposed on the first-second reflective electrode layer.

The embodiment can further include a first connection electrode or a second connection electrode electrically connecting at least one of the first electrode or the second electrode and the second reflective electrode layer of the semiconductor light emitting device.

The embodiment can further include a first light absorbing layer disposed under the insulating layer.

The embodiment can further include a second insulating layer disposed on the first barrier wall and a second light absorbing layer disposed on the second insulating layer.

The embodiment can include a third reflective layer in the insulating layer, and further include a second scattering structure layer on a bottom surface of the light emitting structure of the semiconductor light emitting device.

In an embodiment, the insulating layer can further include an insulating reflective layer.

Effects of the Disclosure

A semiconductor light emitting device for a display panel according to an embodiment and a display device including the same include a light reflective layer on the side of a micro-LED chip and a light scattering and light reflective surface at the bottom of the chip, there is a complex technical effect of improving the color viewing angle by improving the light efficiency of Micro-LED-based Display and at the same time solving the luminance side lobe problem.

Also, the embodiment can improve light output efficiency by limiting the formation of total reflection mode inside the micro-LED based on the light scattering structure, and prevent the light output profile from sensitively responding to the geometry of the chip.

Also, the embodiment has a special technical effect that can improve the Ambient CR (Contrast Ratio) of the display panel by blocking external light incident by disposing the light absorption layer under the pixel structure.

In addition, the embodiment has the following complex technical effect in that the light output profile of the micro-LED chip and pixel is improved, so it is easy to secure the color viewing angle of the display panel, based on the expanded tolerance for the geometry of the micro-LED chip, the chip and panel yield can be increased, and the light output efficiency is improved.

The technical effects of the embodiment are not limited to those described in this item, and include those that can be understood through the specification and drawings.

BRIEF DESCRIPTION OF THE DRAWINGS

FIGS. 1A to 1C are luminance profile data of a Micro-LED-based display in the related technic.

FIG. 2 is an exemplary view of a living room of a house in which the display device 100 according to the embodiment is disposed.

FIG. 3A is a block diagram schematically showing a display device according to an embodiment.

FIG. 3B is a circuit diagram showing an example of the pixel of FIG. 3A;

FIG. 4 is an enlarged view of a first panel area A1 in the display device of FIG. 1;

FIG. 5 is a cross-sectional view taken along line B1-B2 of area A2 of FIG. 4;

FIG. 6 is a view showing an example in which the light emitting device according to the embodiment is assembled on a substrate by a self-assembly method.

FIG. 7 is a partially enlarged view of area A3 of FIG. 6.

FIG. 8 is a cross-sectional view of a first semiconductor light emitting device display 300A according to an embodiment.

FIGS. 9A to 9D are cross-sectional views of a manufacturing process of the first semiconductor light emitting device display 300A according to the embodiment shown in FIG. 8.

FIG. 10A is a cross-sectional view of a first semiconductor light emitting device 150A in the first semiconductor light emitting device display 300A shown in FIG. 8.

FIG. 10B is a cross-sectional view of a first-second semiconductor light emitting device 150A2 according to an additional embodiment.

FIGS. 11 and 12 are light outgoing profile data in comparative Example 1 and comparative Example 2, respectively, compared to the prior art.

FIG. 13 is a comparison data of an outgoing light profile in Example and a comparative light outgoing profile.

FIG. 14 is a cross-sectional view of a second semiconductor light emitting device display 300B according to an embodiment.

FIG. 15 is a cross-sectional view of the second semiconductor light emitting device 150B in the second semiconductor light emitting device display 300B according to the FIG. 14.

FIG. 16 is a cross-sectional view of a third semiconductor light emitting device display 300C according to an embodiment.

DETAILED DESCRIPTION OF THE DISCLOSURE

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. Also, the accompanying drawings are provided for easy understanding of the embodiments disclosed in the present specification, and the technical ideas disclosed in the present specification are not limited by the accompanying drawings. Also, when an element, such as a layer, region, or substrate, is referred to as being 'on' another component, this includes that it is directly on the other element or there can be other intermediate elements in between.

The display device described in this specification can includes a digital TV, a mobile phone, a smart phone, a laptop computer, a digital broadcasting terminal, a personal digital assistant (PDA), a portable multimedia player (PMP), a navigation, a Slate PC, a Tablet PC, an Ultra-Book, a desktop computer, and the like. However, the configuration according to the embodiment described in this specification can be applied to a display capable device even if it is a new product form to be developed later.

Hereinafter, a light emitting device according to an embodiment and a display device including the same will be described.

Hereinafter, a semiconductor light emitting device according to an embodiment and a display device including the same will be described.

FIG. 2 shows a living room of a house in which the display device 100 according to the embodiment is disposed.

The display device 100 of the embodiment may display the status of various electronic products such as the washing machine 101, the robot cleaner 102, and the air purifier 103, and communicate with each electronic product based on IOT, and may control each electronic product based on the user's setting data.

The display apparatus 100 according to the embodiment can include a flexible display manufactured on a thin and flexible substrate. The flexible display can be bent or rolled like paper while maintaining the characteristics of a comparative flat panel display.

In the flexible display, visual information can be implemented by independently controlling light emission of unit pixels arranged in a matrix form. A unit pixel means a minimum unit for realizing one color. The unit pixel of the flexible display can be implemented by a light emitting device. In an embodiment, the light emitting device can be a Micro-LED or a Nano-LED, but is not limited thereto.

FIG. 3A is a block diagram schematically showing a display device according to an embodiment, and FIG. 3B is a circuit diagram showing an example of the pixel of FIG. 3A.

Referring to FIGS. 3A and 3B, the display device according to the embodiment can include a display panel 10, a driving circuit 20, a scan driver 30, and a power supply circuit 50.

The display device 100 of the embodiment may drive the light emitting device in an active matrix (AM) method or a passive matrix (PM, passive matrix) method.

The display panel 10 can be divided into a display area DA and a non-display area NDA disposed around the display area DA. The display area DA is an area in which pixels PX are formed to display an image.

The display panel 10 includes data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a wavelength can be emitted. The first color light can be red light, the second color light can be green light, and the third color light can be blue light, but is not limited thereto. Also, although it is illustrated that each of the pixels PX includes three sub-pixels in FIG. 3A, the present invention is not limited thereto. That is, each of the pixels PX can include four or more sub-pixels.

Each of the first sub-pixel PX1, the second sub-pixel PX2, and the third sub-pixel PX3 may connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Although not shown in the drawing, each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode, but the present invention is not limited thereto.

Referring to FIG. 3B, the plurality of transistors can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst may charge a difference between the gate voltage and the source voltage of the driving transistor DT.

The driving transistor DT and the scan transistor ST can be formed of a thin film transistor. Also, although the driving transistor DT and the scan transistor ST have been mainly described in FIG. 3B as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 3B has been illustrated each of the first sub-pixel PX1, the second sub-pixel PX2, and the third sub-pixel PX3 includes one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Referring back to FIG. 3A, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines Si to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The power supply circuit 50 generates a high potential voltage VDD and a low potential voltage VS S for driving the light emitting devices LD of the display panel 10 from the main power source, and the power supply circuit may supply VDD and VSS to the high-potential voltage line and the low-potential voltage line of the display panel 10. Also, the power supply circuit 50 may generate and supply driving voltages for driving the driving circuit 20 and the scan driving unit 30 from the main power.

Next, FIG. 4 is an enlarged view of the first panel area A1 in the display device of FIG. 1.

Referring to FIG. 4, the display device 100 according to the embodiment can be manufactured by mechanically and electrically connecting a plurality of panel regions such as the first panel region A1 by tiling.

The first panel area A1 can include a plurality of light emitting devices 150 arranged for each unit pixel (PX in FIG. 3A).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3. The unit pixel PX can further include a fourth sub-pixel in which a light emitting device is not disposed, but is not limited thereto. Meanwhile, the light emitting device 150 can be the semiconductor light emitting device.

Next, FIG. 5 is a cross-sectional view taken along line B1-B2 of area A2 in FIG. 4.

Referring to FIG. 5, the display device 100 of the embodiment includes a substrate 200a, wirings 201a and 202a spaced apart from each other, a first insulating layer 211a, a second insulating layer 211b, a third insulating layer 206 and a plurality of light emitting devices 150.

The wiring can include a first wiring 201a and a second wiring 202a spaced apart from each other. The first wiring 201*a* and the second wiring 202*a* may function as panel wiring for applying power to the light emitting device 150 in the panel, and in the case of self-assembly of the light emitting device 150, also, the first wiring 201*a* and the second wiring 202*a* may function as an assembled electrode for generating a dielectrophoresis force.

The wirings 201*a* and 202*a* can be formed of a transparent electrode (ITO) or include a metal material having excellent electrical conductivity. For example, the wirings 201*a* and 202*a* can be formed at least one of titanium (Ti), chromium (Cr), nickel (Ni), aluminum (Al), platinum (Pt), gold (Au), tungsten (W), molybdenum (Mo) or an alloy thereof.

A first insulating layer 211*a* can be disposed between the first wiring 201*a* and the second wiring 202*a*, and a second insulating layer 211*b* can be disposed on the first wiring 201*a* and the second wiring 202*a*. The first insulating layer 211*a* and the second insulating layer 211*b* can be an oxide film, a nitride film, or the like, but are not limited thereto.

The light emitting device 150 can include a red-light emitting device 150R, a green light emitting device 150G, and a blue light emitting device 150B0 to form a sub-pixel, respectively, but is not limited thereto. The light emitting device 150 can include a red phosphor and a green phosphor to implement red and green, respectively.

The substrate 200*a* can be formed of glass or polyimide. Also, the substrate 200*a* can include a flexible material such as polyethylene naphthalate (PEN) or polyethylene terephthalate (PET). Also, the substrate 200 can be made of a transparent material, but is not limited thereto. The substrate 200*a* may function as a support substrate in the panel, and may function as a substrate for assembly when self-assembling the light emitting device.

The third insulating layer 206 can include an insulating and flexible material such as polyimide, PEN, or PET, and can be integrally formed with the substrate 200*a* to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between wirings 201*a* and 202*a* is formed to be smaller than the width of the light emitting device 150 and the width of the assembly hole 203H, so that the assembly position of the light emitting device 150 using an electric field can be more precisely fixed.

A third insulating layer 206 is formed on the wirings 201*a* and 202*a* to protect the wirings 201*a* and 202*a* from the fluid 1200, and the third insulating layer 206 can prevent leakage of current flowing through the two wirings 201*a* and 202*a*. The third insulating layer 206 can be formed of a single layer or multiple layers of an inorganic insulator such as silica or alumina or an organic insulator.

Also, the third insulating layer 206 can include an insulating and flexible material such as polyimide, PEN, PET, etc., and can be formed integrally with the substrate 200 to form a single substrate.

The third insulating layer 206 has a barrier wall, and an assembly hole 203H can be formed by the barrier wall. For example, the third insulating layer 206 can include an assembly hole 203H through which the light emitting device 150 is inserted (refer to FIG. 6). Accordingly, during self-assembly, the light emitting device 150 can be easily inserted into the assembly hole 203H of the third insulating layer 206. The assembly hole 203H can be referred to as an insertion hole, a fixing hole, or an alignment hole.

The assembly hole 203H may have a shape and a size corresponding to the shape of the light emitting device 150 to be assembled at a corresponding position. Accordingly, it is possible to prevent other light emitting devices from being assembled in the assembly hole 203H or from assembling a plurality of light emitting devices.

Next, FIG. 6 is a view showing an example in which the light emitting device according to the embodiment is assembled on a substrate by a self-assembly method, and FIG. 7 is a partially enlarged view of area A3 of FIG. 6. And FIG. 7 is a diagram illustrating a state in which area A3 is rotated 180 degrees for convenience of explanation.

An example in which the semiconductor light emitting device according to the embodiment is assembled in a display panel by a self-assembly method using an electromagnetic field will be described with reference to FIGS. 6 and 7.

The assembly substrate 200 to be described later may also function as the panel substrate 200*a* in the display device after assembly of the light emitting device, but the embodiment is not limited thereto.

Referring to FIG. 6, the semiconductor light emitting device 150 can be put into the chamber 1300 filled with the fluid 1200, and the semiconductor light emitting device 150 by the magnetic field generated from the assembly device 1100 may move to the assembly substrate 200. In this case, the light emitting device 150 adjacent to the assembly hole 203H of the assembly substrate 200 can be assembled in the assembly hole 230 by a dielectrophoretic force by an electric field of the assembly electrodes. The fluid 1200 can be water such as ultrapure water, but is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but is not limited thereto, and a horizontal light emitting device can be employed.

The semiconductor light emitting device 150 can include a magnetic layer (not shown) having a magnetic material. The magnetic layer can include a magnetic metal such as nickel (Ni). Since the semiconductor light emitting device 150 injected into the fluid includes a magnetic layer, it can move to the assembly substrate 200 by the magnetic field generated from the assembly device 1100. The magnetic layer can be disposed above or below or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. Also, the passivation layer 156 can be formed through a method of spin coating an organic material such as a photoresist or a polymer material.

The semiconductor light emitting device 150 can include a first conductivity type semiconductor layer 152*a*, a second conductivity type semiconductor layer 152*c*, and an active layer 152b disposed between the first conductivity type semiconductor layer 152a and the second conductivity type semiconductor layer 152c. The first conductivity type semiconductor layer 152a can be an n-type semiconductor layer, and the second conductivity type semiconductor layer 152c can be a p-type semiconductor layer, but is not limited thereto.

A first electrode layer 154a can be connected to the first conductivity type semiconductor layer 152a, and a second electrode layer 154b can be connected to the second conductivity type semiconductor layer 152c. To this end, a partial region of the first conductivity type semiconductor layer 152a and the second conductivity type semiconductor layer 152c can be exposed to the outside. Accordingly, after the semiconductor light emitting device 150 is assembled on the assembly substrate 200, a portion of the passivation layer 156 can be etched in the manufacturing process of the display device.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembled electrode 201 and the second assembled electrode 202 can be formed including at least one of Cu, Ag, Ni, Cr, Ti, Al, Rh, Pd, Ir, Ru, Mg, Zn, Pt, Au, or Hf, but is not limited thereto. Also, the first assembly electrode 201 and the second assembly electrode 202 can be formed including at least one of indium tin oxide (ITO), indium zinc oxide (IZO), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, and is not limited thereto.

The first assembled electrode 201, the second assembled electrode 202 emits an electric field as an AC voltage is applied, the semiconductor light emitting device 150 inserted into the assembly hole 203H can be fixed by dielectrophoretic force. A distance between the first assembly electrode 201 and the second assembly electrode 202 can be smaller than a width of the semiconductor light emitting device 150 and a width of the assembly hole 203H, the assembly position of the semiconductor light emitting device 150 using the electric field can be more precisely fixed.

An insulating layer 212 is formed on the first assembly electrode 201 and the second assembly electrode 202 to protect the first assembly electrode 201 and the second assembly electrode 202 from the fluid 1200 and leakage of current flowing through the first assembled electrode 201 and the second assembled electrode 202 can be prevented. For example, the insulating layer 212 can be formed of a single layer or multiple layers of an inorganic insulator such as silica or alumina or an organic insulator. The insulating layer 212 may have a minimum thickness to prevent damage to the first assembly electrode 201 and the second assembly electrode 202 when the semiconductor light emitting device 150 is assembled, and it may have a maximum thickness for the semiconductor light emitting device 150 being stably assembled.

A barrier wall 207 can be formed on the insulating layer 212. A portion of the partition wall 207 can be positioned on the first assembly electrode 201 and the second assembly electrode 202, and the remaining region can be positioned on the assembly substrate 200.

On the other hand, when the assembly substrate 200 is manufactured, a portion of the barrier walls formed on the entire upper portion of the insulating layer 212 is removed, an assembly hole 203H in which each of the semiconductor light emitting devices 150 is coupled and assembled to the assembly substrate 200 can be formed.

An assembly hole 203H to which the semiconductor light emitting devices 150 are coupled is formed in the assembly substrate 200, and a surface on which the assembly hole 203H is formed can be in contact with the fluid 1200. The assembly hole 203H may guide an accurate assembly position of the semiconductor light emitting device 150.

Meanwhile, the assembly hole 203H may have a shape and a size corresponding to the shape of the semiconductor light emitting device 150 to be assembled at a corresponding position. Accordingly, it is possible to prevent assembling other semiconductor light emitting devices or assembling a plurality of semiconductor light emitting devices in the assembly hole 203H.

Referring back to FIG. 6, after the assembly substrate 200 is disposed in the chamber, the assembly device 1100 for applying a magnetic field may move along the assembly substrate 200. The assembly device 1100 can be a permanent magnet or an electromagnet.

The assembly device 1100 may move while in contact with the assembly substrate 200 in order to maximize the area applied by the magnetic field into the fluid 1200. According to an embodiment, the assembly device 1100 can include a plurality of magnetic materials or a magnetic material having a size corresponding to that of the assembly substrate 200. In this case, the moving distance of the assembly device 1100 can be limited within a predetermined range.

The semiconductor light emitting device 150 in the chamber 1300 may move toward the assembly device 1100 and the assembly substrate 200 by the magnetic field generated by the assembly device 1100.

Referring to FIG. 7, the semiconductor light emitting device 150 is moving toward the assembly device 1100, it may enter and be fixed into the assembly hole 203H by a dielectrophoretic force (DEP force) formed by the electric field of the assembly electrode of the assembly substrate.

Specifically, the assembly wirings 201 and 202 may form an electric field by an AC power source, and a dielectrophoretic force can be formed between the assembly wirings 201 and 202 by this electric field. The semiconductor light emitting device 150 can be fixed to the assembly hole 203H on the assembly substrate 200 by this dielectrophoretic force.

At this time, a predetermined solder layer (not shown) is formed between the light emitting device 150 and the assembly electrode assembled on the assembly hole 203H of the assembly substrate 200 to can improve the bonding force of the light emitting device 150.

Also, a molding layer (not shown) can be formed in the assembly hole 203H of the assembly substrate 200 after assembly. The molding layer can be a transparent resin or a resin including a reflective material and a scattering material.

By the self-assembly method using the electromagnetic field described above, the time required for each of the semiconductor light emitting devices to be assembled on the substrate can be rapidly reduced, so that a large-area high-pixel display can be implemented more quickly and economically.

One of the technical problems of the embodiment is to provide a semiconductor light emitting device for a display panel capable of improving the light efficiency of a Micro-LED-based display and at the same time improving a color viewing angle, and a display device including the same.

Specifically, one of the technical problems is to solve the problem of occurrence of luminance side lobes in the embodiment. Also, the embodiment is one of the technical tasks to solve the issue of the sensitivity of the outgoing light profile sensitive to the geometry of the micro-LED chip. Also, the embodiment makes the improvement of the ambient CR (Contrast Ratio) of the display panel as one of the technical problems. Also, one of the technical problems of the embodiment is to improve the light output efficiency by improving the light output limit.

FIG. 8 is a cross-sectional view of the first semiconductor light emitting device display 300A according to the embodiment, FIGS. 9A to 9D are cross-sectional views illustrating a manufacturing process of the first semiconductor light emitting device display 300A according to the embodiment shown in FIG. 8.

Referring to FIG. 8, the first semiconductor light emitting device display 300A according to the embodiment can include a first electrode 201, a second electrode 202, a first insulating layer 212 disposed on the first and second electrodes 201 and 202, a first assembly hole 203a (refer to FIG. 9A) disposed on the insulating layer 212, a first semiconductor light emitting device 150A disposed in the first assembly hole 203a.

The embodiment can include at least one of the first electrode 201 or the second electrode 202 and at least one first connection electrode 221 or a second connection electrode 222 electrically connected to the second reflective electrode layer 154b (refer to FIG. 10) of the first semiconductor light emitting device 150A Also, the embodiment can further include a second insulating layer 208 disposed on the first barrier wall 207. Also, the embodiment can further include a first light absorbing layer 205 disposed under the insulating layer 212. Also, the embodiment can further include a second light absorption layer 209 disposed on the second insulating layer 208.

Also, the embodiment can include a third connection electrode 223 electrically connected to the first electrode layer 154a (refer to FIG. 10) of the first semiconductor light emitting device 150A.

Hereinafter, technical features of the first semiconductor light emitting device display 300A according to the embodiment will be described with reference to FIGS. 9A to 9D.

First, FIG. 9A is a cross-sectional view of a first assembly substrate structure 200A in a semiconductor light emitting device display according to an embodiment.

The first assembly substrate structure 200A in the semiconductor light emitting device display according to the embodiment can include a first electrode 201, a second electrode 202, an insulating layer 212 disposed on the first and second electrodes 201 and 202 and a first barrier wall 207 disposed on the insulating layer 212 and including a first assembly hole 203a.

The first barrier wall 207 can include a first-first barrier wall 207a disposed on the first and second electrodes 201 and 202 and a first-second barrier wall 207b disposed on the first-first barrier wall 207a.

The embodiment can include a first light absorbing layer 205 disposed under the insulating layer 212. The first light absorption layer 205 can be formed of any one of Zn, Cu, In, Se, and Ga, but is not limited thereto.

Next, referring to FIG. 9B, the first semiconductor light emitting device 150A is positioned in the first assembly hole 203a of the first assembly substrate structure 200A, as AC power is applied to the first electrode 201 and the second electrode 202, the first semiconductor light emitting device 150A can be assembled on the first electrode 201 and the second electrode 202 by DEP force.

After that, a portion of the heat insulating layer 212 and the first light absorption layer 205 is removed, and a first through hole 210T1 and a second through hole 210T2 exposing the first electrode 201 and the second electrode 202 can be formed.

Thereafter, as shown in FIG. 9C, a first connection electrode 221 and a second connection electrode 222 can be formed in the first through hole 210T1 and the second through hole 210T2, respectively. The first connection electrode 221 or the second connection electrode 222 can be formed by a plating process or a deposition process, but is not limited thereto.

For example, the first connection electrode 221 can include a first-first connection electrode 221a disposed in the first through hole 210T1 and a first-second connection electrode 221b connected to the first-first connection electrode 221a and disposed on one side surface of the first semiconductor light emitting device 150A.

In addition, the second connection electrode 222 can include a second-first connection electrode 222a disposed in the second through hole 210T2 and a second-second connection electrode 222b connected to the second-first connection electrode 222a and disposed on the other side surface of the first semiconductor light emitting device 150A.

Next, as shown in FIG. 9D, a third connection electrode 223 electrically connected to the first electrode layer 154a (refer to FIG. 10) of the first semiconductor light emitting device 150A can be formed. The third connection electrode 223 can be a light-transmitting electrode. The third connection electrode 223 can be formed including at least one of indium tin oxide (ITO), indium zinc oxide (IZO), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, and is not limited thereto.

Thereafter, a second insulating layer 208 can be formed on the barrier wall 207. Also, a second light absorption layer 209 can be formed on the second insulating layer 208.

The second light absorption layer 209 can be formed of any one of Zn, Cu, In, Se, and Ga, but is not limited thereto.

Thereafter, the first assembly hole 203a can be filled with a light-transmitting resin or the like to form the first molding part 210.

Next, FIG. 10A is a cross-sectional view of the first semiconductor light emitting device 150A in the first semiconductor light emitting device display 300A shown in FIG. 8.

The first semiconductor light emitting device 150A according to the embodiment can include a light emitting structure 152 including a first conductivity type semiconductor layer 152a, an active layer 152b, and a second conductivity type semiconductor layer 152c, a first electrode layer 154*a* electrically connected to the first conductivity type semiconductor layer 152*a*, and a second reflective electrode layer 154*b* electrically connected to the second conductivity type semiconductor layer 152*c*.

The first semiconductor light emitting device 150A according to the embodiment can include a passivation layer 156 formed on the surface of the light emitting structure 152.

The first semiconductor light emitting device 150A according to the embodiment can include a first reflective electrode layer 157 disposed on a side surface of the light emitting structure 152.

The first reflective electrode layer 157 can include a first-first reflective electrode layer 157*a* in contact with the side surface of the light emitting structure 152 and first-second reflective electrode layer 157*b* connected to the first-first reflective electrode layer 157*a* and disposed on the passivation layer 156.

The first-first reflective electrode layer 157*a* and the first-second reflective electrode layer 157*b* can be formed of a metal layer including Al, Ag, or an alloy containing Al or Ag, but is not limited thereto.

The first-first reflective electrode layer 157*a* and the first-second reflective electrode layer 157*b* may have electrical conductivity, and a portion of the light emitting structure 152 can be in contact with a lower end surface or a partial side surface thereof to apply power to the light emitting structure 152.

The height of the upper end of the first-second reflective electrode layer 157*b* can be lower than the height of the active layer 152*b*, but is not limited thereto.

The first semiconductor light emitting device 150A according to the embodiment can include a first scattering structure layer 155 disposed on a bottom surface of the light emitting structure 152.

The first scattering structure layer 155 can be formed integrally with the second reflective electrode layer 154*b*, but is not limited thereto.

The second reflective electrode layer 154*b* may function as a reflective metal layer. For example, the second reflective electrode layer 154*b* can be formed of a metal layer including Al, Ag, or an alloy containing Al or Ag, but is not limited thereto.

In addition, the first scattering structure layer 155 can be formed of the same material as that of the second reflective electrode layer 154*b*, but is not limited thereto.

The vertical cross section of the first scattering structure layer 155 can be a polygon, a semicircle, or the like, but is not limited thereto.

The first scattering structure layer 155 can be disposed between the active layer 152*b* which is a light emitting source, and the second reflective electrode layer 154*b* which functions as a reflective layer under the chip.

The first scattering structure layer 155 can be formed by bending the lower end of the light emitting structure 152 or bending the shape of the second reflective electrode layer 154*b*.

Next, FIG. 10B is a cross-sectional view of a first-second semiconductor light emitting device 150A2 according to an additional embodiment.

The first-second semiconductor light emitting device 150A2 may adopt the technical features of the first semiconductor light emitting device 150A, and the following description will be focused on the technical features of the first-second semiconductor light emitting device 150A2

The first-second semiconductor light emitting device 150A2 can include a second passivation layer 159 disposed on the first-second reflective electrode layer 157*b*. The second passivation layer 159 may have an insulating property and a light absorption function.

Referring to FIGS. 9A and 10A together, the first semiconductor light emitting device 150A according to the embodiment includes a first-first reflective electrode layer 157*a* and a first-second reflective electrode layer 157*b* on the side surface of the light source to block light emission to the side, by providing the first scattering structure layer 155 and the second reflective electrode layer 154*b* having a reflective function at the bottom of the light emitting structure 152, there is a special technical effect that can reduce the luminance side lobe generated in the micro-LED display.

In addition, in the case of the pixel structure including the pixel reflector in the embodiment, there is a technical effect of securing additional light efficiency because Fresnel reflection light between the pixel layer and the air layer can be utilized.

In addition, according to the embodiment, the first-first reflective electrode layer 157*a* and the first-second reflective electrode layer 157*b* disposed on the side surface of the light emitting structure 152 not only reflect side light, but also increases the volume occupied by the metal layer in the first semiconductor light emitting device 150A, thereby significantly increasing the dielectric constant. Thereby, there is a special technical effect of improving the assembly speed and assembly accuracy by significantly increasing the DEP force during assembly using dielectrophoresis.

In addition, according to the embodiment, the first-first reflective electrode layer 157*a* disposed on the side surface of the light emitting structure 152 can improve power application efficiency by making contact with the second reflective electrode layer 154*b* and the side surface of the light emitting structure 152, and the first-second reflective electrode layer 157*b* has a special technical effect of remarkably improving electrical characteristics by remarkably improving the contact area of the first and second connection electrodes 221 and 222 to be formed later.

In addition, the first-second reflective electrode layer 157*b* is disposed to extend above the passivation layer 156 disposed on the side surface of the light emitting structure 152, there is a special technical effect of improving the electrode area and the reflective area while eliminating the possibility of contact with the active layer 152*b* or the first conductivity type semiconductor layer 152*a*.

FIGS. 11 and 12 are light outgoing profile data compared to the comparative in the first and second comparative example, respectively, and FIG. 13 is comparative data of the light outgoing profile in example and the comparative light outgoing profile.

Referring to FIG. 11, the comparative structure (Ref) has a structure without a reflective metal on the side surface of the semiconductor light emitting device, and the first comparative example has a structure with a reflective metal on the side surface of the semiconductor light emitting device.

A lot of total light reflection occurs inside the LED chip, and when a metal reflective layer is deposited on the side of the LED, the light absorption rate of metal reflection is higher than that of total dielectric light reflection, so in many cases, the amount of emitted light decreases.

For example, in the comparative structure (Ref), the emitted light amount was about 14.0 (lm), but in the first comparative example (R1), the emitted light amount was about 11.2 (lm), which decreased by about 20%.

Accordingly, in the related art, a metal reflective layer is not formed on the side surface of the LED except for arranging a reflective plate at the bottom of the light emitting device chip.

In particular, in the first comparative example (Ref), in the case of a combination of a metal reflective layer LED and a pixel with a bottom reflector, there is a technical problem in that there is a significant level of luminance side lobe (SLR1) issue as well as a significant reduction in output light of about 20%.

Next, referring to FIG. 12, the related art (Ref) has a structure without a reflective metal layer on the side of the semiconductor light emitting device, and comparative example 1 has a structure with a scattering layer at the bottom of the semiconductor light emitting device.

In the comparative structure, the output amount was about 14.0 (lm), but in Comparative Example 2 (R2), the output amount was about 15.3 (lm), which slightly increased by about 9.2%.

In the case of an LED with a sapphire substrate attached, it has been studied that an LED with a PSS scattering structure increases the output light by about 30% compared to an LED without a scattering structure.

However, the PSS LED from which the sapphire substrate has been removed for a Micro-LED display, is used, and when this PSS LED chip is placed on the reflector of the pixel, the luminance increase rate is less than 10%, and the luminance side lobe issue is also not solved.

Referring to FIG. 12, in the case of a combination of a PSS LED and a pixel with a lower reflector, the amount of light output slightly is increased by about 9.2%, but a significant level of luminance Side Lobe (SLR2) issue still remains a problem.

Next, referring to FIG. 13, the comparative (Ref) has a structure without a reflective metal on the side surface of the semiconductor light emitting device. But, as shown in FIG. 10A, the first semiconductor light emitting device 150A according to the embodiment (E) includes a first-first reflective electrode layer 157a and a first-second reflective electrode layer 157b on the side surface of the light source to block light emission to the side, by providing the first scattering structure layer 155 and the second reflective electrode layer 154b having a reflective function at the bottom of the light emitting structure 152, there is a special technical effect that can reduce the luminance side lobe generated in the micro-LED display.

Specifically, in the comparative structure (Ref), the output amount was about 14.0 (lm), but in Example (E), the output amount was about 17.3 (lm), which significantly increased by about 23.6%

In particular, in the embodiment, a first-first reflective electrode layer 157a and a first-second reflective electrode layer 157b are provided on the side of the light emitting structure 152 to block light emission to the side, by providing the first scattering structure layer 155 and the second reflective electrode layer 154b having a reflective function at the bottom of the light emitting structure 152, not only the side emission amount is reduced, but also the emission amount is improved by about 24%. In particular, in the embodiment, the amount of light emitted in the vertical direction is increased to achieve a level similar to the amount of light emitted at a high angle, and a more uniform luminance profile can be secured at all angles.

Accordingly, the embodiment can secure more advanced functions by increasing the vertical luminance and solve the issues of the existing technology, and the luminance Side Lobe (SLE) in the embodiment has a special technical effect that is significantly improved. This technical effect was an effect that was difficult to predict with the combination of the comparative structures.

Next, FIG. 14 is a cross-sectional view of the second semiconductor light emitting device display 300B according to the embodiment, FIG. 15 is a cross-sectional view of the second semiconductor light emitting device 150B in the second semiconductor light emitting device display 300B according to the 14th embodiment.

The second semiconductor light emitting device display 300B and the second semiconductor light emitting device 150B may adopt the technical features of the first semiconductor light emitting device display 300A and the first semiconductor light emitting device 150A described above. Hereinafter, main characteristics of the second semiconductor light emitting device display 300B and the second semiconductor light emitting device 150B will be described.

Referring to FIGS. 14 and 15, the second semiconductor light emitting device display 300B can include a third reflective layer 250 in the insulating layer 212 and a second scattering structure layer 155b disposed on the bottom surface of the light emitting structure 152 of the second semiconductor light emitting device 150B The third reflective layer 250 can be formed of a metal layer including Al, Ag, or an alloy containing Al or Ag, but is not limited thereto.

The second scattering structure layer 155b can be formed of the same material as that of the third reflective layer 250, but is not limited thereto. The vertical cross section of the second scattering structure layer 155b can be a polygon, a semicircle, or the like, but is not limited thereto.

The second semiconductor light emitting device display 300B includes a first-first reflective electrode layer 157a and a first-second reflective electrode layer 157b on the light source side of the second semiconductor light emitting device 150B to block light emission to the side. Also, by including the second scattering structure layer 155b and the third reflective layer 250 having a reflective function at the bottom of the light emitting structure 152, the vertical component of the light emitted from the light source can be increased to increase the luminous efficiency, the light scattering structure has a technical effect of increasing the light efficiency by extracting the trap light inside the LED and at the same time having a light output effect closer to Lambertian based on the diffusing effect.

In addition, in the embodiment, the amount of light emitted in the vertical direction is increased, achieving a level similar to the amount of light emitted at a high angle, and a more uniform luminance profile can be secured at all angles.

Accordingly, the embodiment can secure more advanced functions by increasing the vertical luminance and solve the issues of the existing technology, and the luminance Side Lobe (SLE) in the embodiment has a special technical effect that is significantly improved.

Next, FIG. 16 is a cross-sectional view of a third semiconductor light emitting device display 300C according to an embodiment.

The third semiconductor light emitting device display 300C and the second semiconductor light emitting device 150B can adopt technical features of the first and second semiconductor light emitting device displays 300A and 300B and the second semiconductor light emitting device 150B described, hereinafter, main characteristics of the third semiconductor light emitting device display 300C will be described.

Referring to FIG. 16, in the third semiconductor light emitting device display 300C, the insulating layer can be the insulating reflective layer 212B.

For example, the insulating reflective layer 212B can be a DBR (Distributed Bragg Reflector) including a plurality of insulating layers, but is not limited thereto.

The third semiconductor light emitting device display 300C can include a first-first reflective electrode layer 157a and a first-second reflective electrode layer 157b on the light source side of the second semiconductor light emitting device 150B to block light emission to the side. Also, by including the second scattering structure layer 155b and the insulating reflective layer 212B having a reflective function at the bottom of the light emitting structure 152, the vertical component of the light emitted from the light source is increased to increase the luminous efficiency, the light scattering structure has a technical effect of increasing the light efficiency by extracting the trap light inside the LED and at the same time having a light output effect closer to Lambertian based on the diffusing effect.

In addition, in the embodiment, the amount of light emitted in the vertical direction increased, achieving a level similar to the amount of light emitted at a high angle, and a more uniform luminance profile could be secured at all angles.

Accordingly, the embodiment is able to secure more advanced functions by increasing the vertical luminance and to solve the issues of the existing technology, and the embodiment has a special technical effect in that the luminance Side Lobe (SLE) can be significantly improved.

The above detailed description should not be construed as restrictive in all respects and should be considered as exemplary. The scope of the embodiments should be determined by a reasonable interpretation of the appended claims, and all modifications within the equivalent scope of the embodiments are included in the scope of the embodiments.

INDUSTRIAL APPLICABILITY

The embodiment can be applied to a display field for displaying images or information.

The embodiment can be applied to a display field for displaying an image or information using a semiconductor light emitting device.

The embodiment can be employed in a display field for displaying images or information using micro- or nano-level semiconductor light emitting devices.

What is claimed is:

1. A display device comprising:
   a first electrode and a second electrode spaced apart from each other on a predetermined substrate;
   an insulating layer disposed on the first and second electrodes;
   a first barrier wall disposed on the insulating layer and comprising a first assembly hole;
   a semiconductor light emitting device disposed in the first assembly hole, the semiconductor light emitting device comprising a light emitting structure including a first conductivity type semiconductor layer, an active layer, and a second conductivity type semiconductor layer;
   a first electrode layer electrically connected to the first conductivity type semiconductor layer;
   a passivation layer disposed on the light emitting structure;
   a first reflective electrode layer disposed on a side surface of the light emitting structure;
   a third reflective layer in the insulating layer; and
   a second scattering structure layer on a bottom surface of the light emitting structure of the semiconductor light emitting device.

2. The display device according to claim 1, wherein the first reflective electrode layer comprising a first-first reflective electrode layer in contact with the side surface of the light emitting structure and a first-second reflective electrode layer connected to the first-first reflective electrode layer and disposed on the passivation layer.

3. The display device according to claim 2, further comprising a second passivation layer disposed on the first-second reflective electrode layer.

4. A display device comprising:
   a first electrode and a second electrode spaced apart from each other on a predetermined substrate;
   an insulating layer disposed on the first and second electrodes;
   a first barrier wall disposed on the insulating layer and comprising a first assembly hole;
   a semiconductor light emitting device disposed in the first assembly hole, the semiconductor light emitting device comprising a light emitting structure including a first conductivity type semiconductor layer, an active layer, and a second conductivity type semiconductor layer;
   a first electrode layer electrically connected to the first conductivity type semiconductor layer;
   a passivation layer disposed on the light emitting structure;
   a first reflective electrode layer disposed on a side surface of the light emitting structure;
   a first scattering structure layer disposed on a bottom surface of the light emitting structure; and
   a first light absorbing layer disposed under the insulating layer,
   wherein the first reflective electrode layer comprises
      a first-first reflective electrode layer in contact with a side surface of the light emitting structure, and
      a first-second reflective electrode layer connected to the first-first reflective electrode layer and disposed on the passivation layer.

5. The display device according to claim 4, further comprising a second insulating layer disposed on the first barrier wall and a second light absorbing layer disposed on the second insulating layer.

6. A display device comprising:
   a first electrode and a second electrode spaced apart from each other on a predetermined substrate;
   an insulating layer disposed on the first and second electrodes;
   a first barrier wall disposed on the insulating layer and comprising a first assembly hole;
   a semiconductor light emitting device disposed in the first assembly hole, the semiconductor light emitting device comprising a light emitting structure including a first conductivity type semiconductor layer, an active layer, and a second conductivity type semiconductor layer;
   a first electrode layer electrically connected to the first conductivity type semiconductor layer;
   a passivation layer disposed on the light emitting structure;
   a first reflective electrode layer disposed on a side surface of the light emitting structure; and
   a first light absorbing layer disposed under the insulating layer.

7. The display device according to claim 6, further comprising a second insulating layer disposed on the first barrier wall and a second light absorbing layer disposed on the second insulating layer.

* * * * *